United States Patent [19]
Davis

[11] Patent Number: 4,868,570
[45] Date of Patent: Sep. 19, 1989

[54] METHOD AND SYSTEM FOR STORING AND RETRIEVING COMPRESSED DATA

[75] Inventor: Glenn T. Davis, Arlington, Va.

[73] Assignee: Arthur D. Little, Inc., Cambridge, Mass.

[21] Appl. No.: 144,380

[22] Filed: Jan. 15, 1988

[51] Int. Cl.⁴ .............................................. H03M 7/42
[52] U.S. Cl. ..................................... 341/106; 341/67; 209/584
[58] Field of Search ..................... 341/50, 65, 67, 106, 341/51; 235/494; 209/584, 547, 900, 583

[56] References Cited

U.S. PATENT DOCUMENTS 4,355,306 10/1982 Mitchell ..................... 340/347 DD
4,641,753  2/1987 Tamada ................................ 209/546
4,645,916  2/1987 Raisleger ............................ 235/494
4,653,021  3/1987 Takagi .................................. 364/900

Primary Examiner—William M. Shoop, Jr.
Assistant Examiner—Brian Young
Attorney, Agent, or Firm—Edward J. Kondracki

[57] ABSTRACT

A method and system for storing and retrieving compressed data such as ZIP+4 add-on's for postal addresses, compresses source data records by defining a group of attributes which represent the characteristics of source data records and the relationships between source data records and between elements of source data records, each attribute having an associated predetermined set of rules which define specifically the characteristics or relationships represented by that attribute. Source data records are compressed by assigning to a record a tuple of attribute values and a set of modifier values. The attribute values each designate a particular one of the set of rules for its corresponding attribute, and the modifier values comprise values which are used by the rules to express the information content of the source data record. The compressed data records are stored in a memory having a hierarchical data organization along with memory address elements for accessing compressed data records. The memory is controlled by a microprocessor which accesses compressed data records, decodes the identifier and modifier fields of the record, and decompresses the record in accordance with the rules specified by the attribute values.

57 Claims, 18 Drawing Sheets

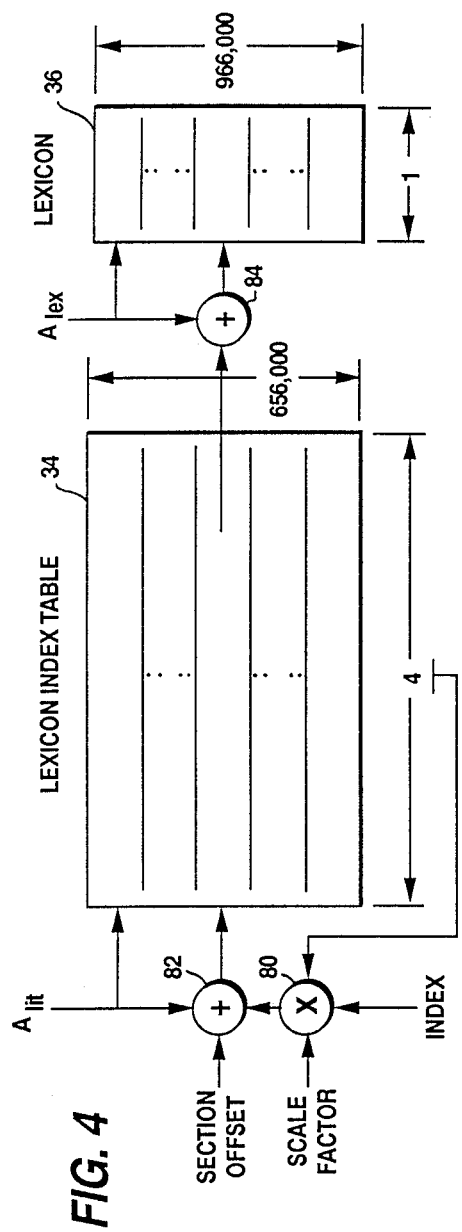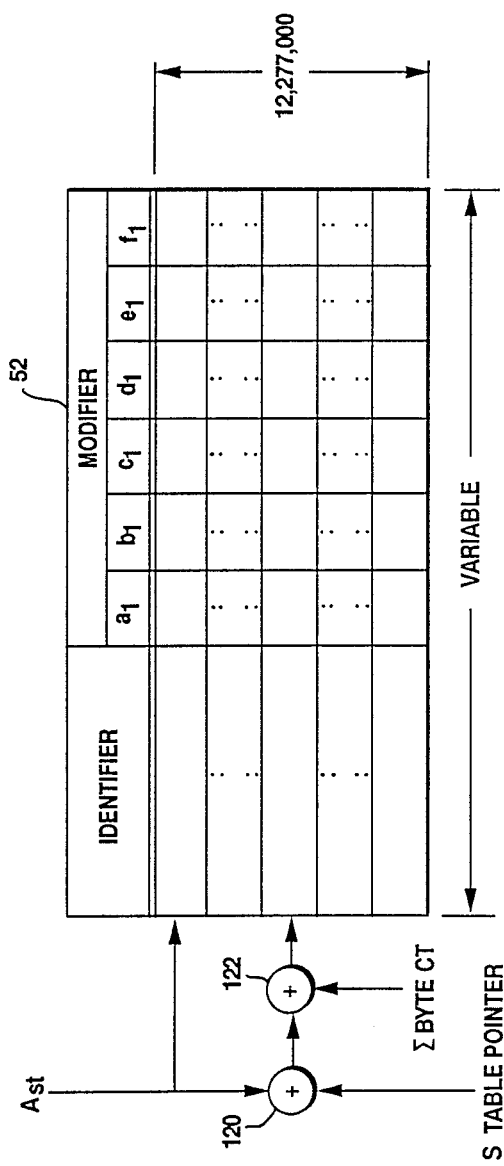
FIG. 4
FIG. 11

FIG. 5

| 31 | 29 28 | 26 25 | 21 20 | 0 |
|---|---|---|---|---|
| 0 0 0 | ALIAS COUNT | CHARACTER COUNT | LEXICON DISPLACEMENT | TYPE 0 |

| 31 | 29 28 | 26 25 | 13 12 | 0 |
|---|---|---|---|---|
| 1 0 0 | ALIAS COUNT | FIRST TABLE INDEX | SECOND TABLE INDEX | TYPE 4 |

| 31 | 29 28 | 26 25 | 13 12 | 0 |
|---|---|---|---|---|
| 1 0 1 | ALIAS COUNT | FIRST TABLE INDEX | SECOND TABLE INDEX | TYPE 5 |

| 31 | 29 28 | 26 25 | 13 12 | 0 |
|---|---|---|---|---|
| 1 1 0 | ALIAS COUNT | FIRST TABLE INDEX | SECOND TABLE INDEX | TYPE 6 |

| 31 | 29 28 | 26 25 | 13 12 | 0 |
|---|---|---|---|---|
| 1 1 1 | ALIAS COUNT | FIRST TABLE INDEX | SECOND TABLE INDEX | TYPE 7 |

FIG. 10

CODES FOR DIRECTIONALS

| PRE \ POST | (NONE) | N | E | S | W | NE | NW | SE | SW |
|---|---|---|---|---|---|---|---|---|---|
| (NONE) | 0 | 110000 | 110001 | 110010 | 110011 | 110100 | 110101 | 110110 | 110111 |
| N | 1000 | 1111000000 | 1111000001 | 1111000010 | 1111000011 | 1111000100 | 1111000101 | 1111000110 | 1111000111 |
| E | 1001 | 1111001000 | 1111001001 | 1111001010 | 1111001011 | 1111001100 | 1111001101 | 1111001110 | 1111001111 |
| S | 1010 | 1111010000 | 1111010001 | 1111010010 | 1111010011 | 1111010000 | 1111010001 | 1111010010 | 1111010011 |
| W | 1011 | 1111011000 | 1111011001 | 1111011010 | 1111011011 | 1111011100 | 1111011101 | 1111011110 | 1111011111 |
| NE | 111000 | 1111100000 | 1111100001 | 1111100010 | 1111100011 | 1111100100 | 1111100101 | 1111100110 | 1111100111 |
| NW | 111001 | 1111101000 | 1111101001 | 1111101010 | 1111101011 | 1111101100 | 1111101101 | 1111101110 | 1111101111 |
| SE | 111010 | 1111110000 | 1111110001 | 1111110010 | 1111110011 | 1111110100 | 1111110101 | 1111110110 | 1111110111 |
| SW | 111011 | 1111111000 | 1111111001 | 1111111010 | 1111111011 | 1111111100 | 1111111101 | 1111111110 | 1111111111 |

FIG. 16

FIRST STREET LIST DECODING TABLE (4096)

| 31 | 28 27 | 24 23 | 12 11 | 8 7 | 4 3 | 0 |
|---|---|---|---|---|---|---|
| DELTA | NEXT FIELD | SUFFIX DISPLACEMENT | SUF. LENGTH | POST | PRE | |
| ... | ... | ... | ... | ... | ... | |

SECOND STREET LIST DECODING TABLE (2048)

| 31 | 28 27 | 24 23 | 12 11 | 8 7 | 0 |
|---|---|---|---|---|---|
| DELTA | NEXT FIELD | SUFFIX DISPLACEMENT | SUF. LENGTH | (NOT USED) | |
| ... | ... | ... | ... | ... | |

| NEXT FIELD | INTERPRETATION |
|---|---|
| 0000 | 11-BIT INDEX OF STREET NAME |
| 0001 | 19-BIT INDEX OF STREET NAME |
| 0010 | LENGTH SPECIFIER |
| 0011 | CODE FOR SUFFIX |

| PRE POST | INTERPRETATION |
|---|---|
| 0000 | (NOT PRESENT) |
| 1000 | NORTH |
| 1001 | EAST |
| 1010 | SOUTH |
| 1011 | WEST |
| 1100 | NORTHEAST |
| 1101 | NORTHWEST |
| 1110 | SOUTHEAST |
| 1111 | SOUTHWEST |

SUFFIX STRING FILE

S IDENTIFIER DECODING TABLE

| | IDENTIFIER LENGTH (0-5) | STATUS (6-9) | ATTRIBUTE VALUES (10-31) | | | | | | MODIFIER LENGTH (32-39) | MODIFIER SUBFIELD LENGTHS (40-63) | | | | | |
|---|---|---|---|---|---|---|---|---|---|---|---|---|---|---|---|
| | | | a | b | c | d | e | f | | La₁ | Lb₁ | Lc₁ | Ld₁ | Le₁ | Lf₁ |
| | ... | ... | ... | ... | ... | ... | ... | ... | ... | ... | ... | ... | ... | ... | ... |

S MODIFIER SUBFIELD LENGTH LOOKUP TABLE

| VALUE | ATTRIBUTE | | | | | |
|---|---|---|---|---|---|---|
| | a | b | c | d | e | f |
| 0 | 0 | 0 | 0 | 0 | 0 | 0 |
| 1 | 0 | 0 | 0 | 0 | 0 | 0 |
| 2 | 1 | 0 | 2 | 0 | 0 | 0 |
| 3 | 2 | 7 | 2 | 1 | 1 | 0 |
| 4 | 3 | | 4 | 1 | 1 | 0 |
| 5 | 4 | | 4 | 2 | 2 | 2 |
| 6 | 5 | | 7 | 2 | 2 | 2 |
| 7 | 6 | | | 4 | 4 | 4 |
| 8 | 7 | | | 4 | 4 | 4 |
| 9 | 14 | | | 7 | 7 | 7 |

| STATE | a = 0 | | | | | | | | | a ≠ 0 | | | | | |
|---|---|---|---|---|---|---|---|---|---|---|---|---|---|---|---|
| | c = 0 | | | c ≠ 0 | | | c = 0 | | | c ≠ 0 | | |
| | f=0 | f=1 | f≥2 | f=0 | f=1 | f≥2 | f=0 | f=1 | f≥2 | f=0 | f=1 | f≥2 |
| 0 | 2 | 6 | 8 | 1 | 3 | 4 | 2 | 6 | 8 | 1 | 3 | 4 |
| 1 | 2 | 7 | 8 | 1 | 4 | 4 | 2 | 6 | 8 | 1 | 3 | 4 |
| 2 | 2 | 8 | 8 | 2 | 5 | 5 | 2 | 6 | 8 | 1 | 3 | 4 |
| 3 | 5 | 6 | 8 | 4 | 3 | 4 | 2 | 6 | 8 | 1 | 3 | 4 |
| 4 | 5 | 7 | 8 | 4 | 4 | 4 | 2 | 6 | 8 | 1 | 3 | 4 |
| 5 | 5 | 8 | 8 | 5 | 5 | 5 | 2 | 6 | 8 | 1 | 3 | 4 |
| 6 | 8 | 6 | 8 | 7 | 6 | 7 | 2 | 6 | 8 | 1 | 3 | 4 |
| 7 | 8 | 7 | 8 | 7 | 7 | 7 | 2 | 6 | 8 | 1 | 3 | 4 |
| 8 | 8 | 8 | 8 | 8 | 8 | 8 | 2 | 6 | 8 | 1 | 3 | 4 |

METHOD AND SYSTEM FOR STORING AND RETRIEVING COMPRESSED DATA

BACKGROUND OF THE INVENTION

The present invention relates generally to data compression and decompression techniques, and more particularly to methods and systems for data compression and decompression which afford high coding and storage efficiency and fast retrieval of data from very large data bases while preserving full information content.

Data processing applications which utilize very large data bases pose a number of problems. This is particularly true of real time data processing applications which require multiple accesses to very large data bases and fast data retrieval. Such real time data processing applications generally have been hampered by the rather slow data access time of most mass data storage mediums. Although significant advances in the data storage capacity of mass data storage devices such as magnetic tape, hard magnetic disks and optical disks have occurred, the rather slow data access time of such devices has been a limiting factor on the speed of real time data processing applications which require such devices for storing large data bases.

An example of a real time data processing application which requires multiple accesses to a very large data base and fast data retrieval is the automatic sorting of mail. In order to process efficiently the huge volume of mail handled by the U.S. Postal Service, automated sorting systems have been developed, and are under development, for sorting mail automatically. Multiline optical character readers exist which are capable of recognizing and reading the address from a piece of mail. The read address may then be used to control an automatic sorting machine which sorts the mail according to its destination. The principal component of the address employed for sorting is the ZIP Code. There are approximately 42,000 postal zones in the United States, each of which has been assigned an unique five digit ZIP Code. After reading the ZIP Code, ink jet printers may be used for printing a corresponding bar code on the mailpiece. Bar code scanners read the bar code and sort the mailpiece accordingly.

In order to facilitate the handling of mail, it is desirable to sort the mail automatically down to a much lower level than the postal zone level. To accomplish this, the U.S. Postal Service has developed a system of four digit add-on's which subdivide a postal zone into much smaller areas. This produces a nine digit ZIP+4 Code of the form 123456789, where "12345" is the five digit ZIP Code, and "6789" is the four digit add-on. The first two digits of the add-on "67" are referred to as the sector, and the last two digits "89" are referred to as the segment.

Every address in the United States has been assigned a four digit add-on, and the assignments have been published in a ZIP+4 National Directory comprising some 47 volumes, each about the size of a medium-sized telephone directory. An add-on may designate addresses within one or more blocks of a street, even or odd-numbered addresses on one side of a street within a block, a particular address within a block such as an office or apartment building, a particular floor of a building, or even a firm within the building. Add-on's have also been assigned to rural route, post office box, general delivery, and postmaster addresses. The objective of the system of add-on's is to enable mail to be sorted automatically to a low level. The use of ZIP+4 Codes by mailers is voluntary, and most mail does not have the add-on. Accordingly, automatic sorting requires a data processing operation to retrieve the appropriate add-on for bar coding onto the mailpiece along with the ZIP Code.

The ZIP+4 National Directory File comprises around 25 million records and requires a storage capacity of the order of 1,300 megabytes (MB) to store the source data necessary for retrieving add-on's for postal addresses. A mass data storage device is required to store a data base of this size. Unfortunately, the data access time of such devices is too slow to permit their use with current optical character readers, which are capable of processing twelve pieces of mail each second, especially since multiple accesses are needed, and a much faster data storage medium is necessary to support the real time on-line retrieval of add-on's. Although semiconductor memory is fast enough for such real time processing, it is impractical to use semiconductor memory to store a data base of this size.

Even where fast access time is not a necessity, the size of the ZIP+4 National Directory data base presents other problems. It is advantageous, for example, for commercial mailers to use ZIP+4 add-on's, and the U.S. Postal Service has made the ZIP+4 National Directory available on optical disk, for example. Although optical disks and readers are relatively inexpensive, the data access time for optical disks is far too slow even for most commercial mailers. Hard disks have data access times which are about 300 times faster than optical disks. However, a hard disk for storing a data base the size of the ZIP+4 National Directory is relatively large and expensive, and requires a somewhat sophisticated computer system, which may be more than a small business user can afford.

The problems of size and access time can both be addressed by reducing the size of the ZIP+4 National Directory data base to one which is capable of being stored in a data storage medium having fast access time to support real time processing operations, such as the automatic sorting of mail, and to a size which is amenable to being stored in a less sophisticated and less expensive system so that it is more available to small users. It is to these ends that the present invention is directed.

SUMMARY OF THE INVENTION

The invention affords a highly effective method and system for compressing and storing data to achieve high coding and storage efficiency and fast data retrieval, while preserving full information content of the source data. The invention is particularly applicable to compressing and storing very large data bases for use in data processing applications which require multiple accesses to the data base and fast data retrieval to support real time data processing applications. The invention may afford a data compression of the order of 97%, and such that the compressed data base may be conveniently stored in a semiconductor memory. The invention is also highly advantageous for reducing the size of a large data base to one which can be conveniently stored in a relatively inexpensive mass data storage medium, such as a hard disk of a personal computer, so that the data base may be made more available to small users.

Broadly, the invention involves a data organization and data structures which take advantage of characteristics and relationships which exist in the original source data, and coding and decoding processes which reflect these characteristics and relationships. A significant aspect of the invention is the use of attribute modeling and coding to compress source data records. This involves defining a set of attributes which designate generally the characteristics of source data records, such as format, and the relationships between the elements of a source data record or between the elements of a source data record and the elements of another source data record. Each attribute has associated with it a predetermined set of rules which define specifically the particular characteristics or relationships represented by that attribute. The particular rule of each set which is used for a given attribute is indicated by assigning a value to that attribute which designates the rule. The set of attribute values for a particular record form a tuple. The tuple is preferably assigned a variable length code with the more common tuples being given the shortest length codes, and the code may be stored in an identifier field of the corresponding compressed data record. In some instances, a rule specified by an attribute value itself expresses a particular characteristic or relationship directly. In other instances, the rule is used with a modifier value to express the characteristic or relationship. The modifier values are contained in a modifier field of the compressed data record which is concatenated with the identifier field. Accordingly, in most cases, a compressed data record does not explicitly represent source data, but rather comprises a code representing a set of rules and a set of modifier values for use with the rules for reproducing the information content of the corresponding source data record.

Since source data records comprise variable length records, the invention employs program data structures which are utilized by a memory controller, such as a microprocessor, for decoding compressed data records. The program data structures indicate, for example, the lengths of the identifier field and the various subfields of the modifier field which contain modifier values. The controller also embodies a set of programs which process compressed data records in accordance with the rules specified by the attribute values of the record to reproduce the information content of the record.

Briefly stated, in one aspect, the invention provides a method of storing and retrieving data which comprises defining a group of attributes which represent characteristics of source data records and relationships between elements of source data records, each attribute having an associated predetermined set of rules which define the characteristics or relationships represented by that attribute. Each rule of the set is designated by a corresponding attribute value. Source data records are assigned a set of attribute values, one value for each of the attributes, which designate a particular one of the rules of the associated set of rules which is applicable to the source data record. The source data record is also assigned a set of modifier values for use with the rules designated by the attribute values and which together with the rules express the information content of the source data record. The attribute values and modifier values are used to form a compressed data record, which is stored in place of the source data record.

In another aspect, the invention provides a method of compressing source data which includes a multiplicity of source data records that comprises sorting the source data records into sequential order; constructing corresponding compressed data records by forming each compressed data record as a combination of a code which designates a relationship between successive source data records and a set of values which together with the relationship specify the information content of the source data record in terms of the information content of a previous source data record. The compressed data records are stored in place of the source data records.

In yet another aspect, the invention provides a method of storing ZIP+4 postal source data in compressed form and of retrieving a ZIP+4 add-on for given postal address that comprises, for each of a plurality of different types of postal addresses, ordering source data records into a hierarchical organization which is inherent in the source data; and compressing the ordered source data records to produce corresponding compressed data records which contain an address range and add-on's for addresses in that range. Source data records are compressed by defining sets of rules which prescribe ways of computing range values and add-on's in terms of other range values and add-on's, and assigning to each compressed data record a tuple of attribute values which specify particular rules of the sets of rules and modifier values for use with the rules specified by the attribute values for reproducing the information contained in the corresponding source data record. Compressed data records are stored in a corresponding table in a memory which includes a plurality of files in each table, one for each zip code. There are a plurality of tables, one for each type of postal address. A zip code for a given postal address is converted into a memory address which accesses the corresponding file in the appropriate table. Compressed data records in the accessed file are then sequentially decoded and the given postal address is compared with the address range in each decoded compressed data record. Upon a match being obtained, the add-on for the given postal address is computed.

In another aspect, the invention provides a system for storing and retrieving data which comprises a memory for storing compressed data records corresponding to source data records. Each compressed data record comprises an identifier and a modifier which are concatenated, the identifier comprising a code representing a tuple of attribute values which designate particular ones of a predetermined set of rules which specify relationships between elements of a corresponding source data record and between the source data record and another source data record. The modifier comprises a set of modifier values for use with the rules designated by the attribute values for reproducing the information content of the corresponding source data record; and controller means is provided for retrieving compressed data records from the memory and processing the compressed data records in accordance with the rules designated by the attribute values and in accordance with the modifier values to reproduce the information content of the corresponding source data record.

In a further aspect, the invention provides a system for storing ZIP+4 postal information and for retrieving a zip code add-on for a given postal address. The system comprises memory means for storing compressed ZIP+4 postal source data, and a controller for retrieving and decompressing the compressed source data. The memory means comprises a plurality of tables for storing compressed data records for different types of postal addresses. The memory means further comprises a first array for converting a zip code representative of a postal zone into a corresponding Zip Index; a plurality of second arrays, each accessed by the Zip Index, for storing address pointers to locations of files in the tables corresponding to the Zip Index, each file comprising a plurality of concatenated compressed data records, each of which comprises an identifier field and a modifier field. The identifier field contains a code representative of a tuple of attribute values which designate a predetermined set of rules which specify relationships between elements of a corresponding source data record and between the corresponding source data record and another source data record. The modifier field comprises a set of modifier values for use with the rules specified by the attribute values for reproducing the information contained in the corresponding source data record.

Other more specific features and aspects of the invention will become apparent from the description which follows.

BRIEF DESCRIPTION OF THE DRAWINGS

FIG. 4 illustrates a Lexicon Set of the directory of FIG. 2;

FIG. 5 is a diagram illustrating the format of different types of Lexicon Index Table records;

FIG. 10 is a table illustrating possible code assignments for combinations of directionals;

FIG. 11 illustrates the S Table of the directory memory of FIG. 2;

FIG. 16 illustrates First and Second Street List Decoding Tables comprising program data structures for decoding Street List records;

FIG. 20 illustrates a S Identifier Decoding Table program data structure for decoding S records;

FIG. 21 illustrates a S Modifier Subfield Length Lookup Table for decoding S records;

FIG. 22 illustrates a STATUS Lookup Table for decoding S records;

DESCRIPTION OF A PREFERRED EMBODIMENT

The present invention is applicable to the compression and storing of any source data base where high coding and storage efficiency are desired while preserving full information content, and especially where fast data retrieval from a large data base is necessary to support a real time data processing function. It is particularly applicable to the compression and storage of ZIP+4 National source data to retrieve ZIP+4 add-on codes for postal addresses in support of the automatic sorting of mail, and will be described in that context. However, as will become apparent, this is illustrative of only one utility of the invention, and it may be employed to significant advantage with other data bases, one example being a national telephone directory.

As will also become apparent, the invention is applicable to data processing applications where fast data retrieval is not necessarily a requirement but where it is desired to compress a very large data base to a size which may be conveniently stored in a relatively inexpensive and unsophisticated mass data storage medium. For example, the invention compresses the 1,300 megabyte ZIP+4 source data base to approximately 42 megabytes, which may be easily stored on a hard disk of a personal-type computer. This makes the ZIP+4 National Directory readily available to small businesses while still providing reasonably fast data retrieval.

Figure 1:
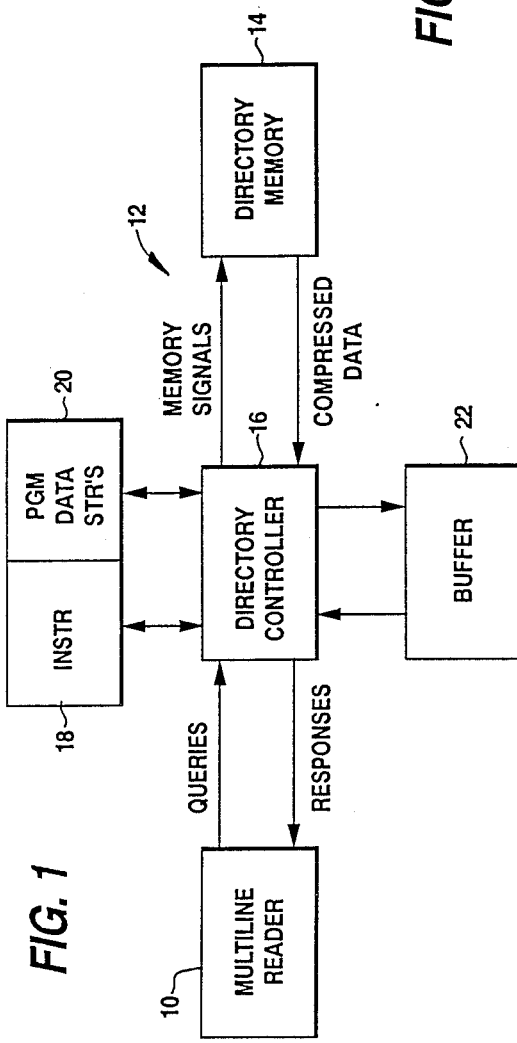
FIG. 1 is a block diagram illustrating a data processing system embodying the invention.

FIG. 1 is a simplified block diagram of a data processing system embodying the invention. As shown, the system may comprise a user subsystem which includes a multiline optical character reader (OCR) 10 which is interfaced to a directory 12 comprising a directory memory 14 and a directory controller 16 which interfaces the directory memory to the reader. The reader forms no part of the present invention and may be considered more generally to be simply a user data processing system which generates and sends data requests termed "Queries" herein, to the directory and receives data back from the directory in the form of "Responses". As will be described in more detail shortly, directory memory 14, which may comprise semiconductor RAM, stores compressed and encoded data which may include ZIP+4 add-on's and other elements of postal addresses used in the retrieval of add-on's, and memory address components including bases, offsets, counts, displacements, pointers and indexes which are used to retrieve the compressed data. Directory controller 16 may comprise a 32-bit Intel type 80386 microprocessor based CPU operating in real address mode at 16 MHz. The directory controller includes instruction and program data structure memories 18 and 20, respectively, and a buffer 22 which may be used for output. The directory controller responds to the queries by issuing appropriate memory signals to the directory memory to retrieve the desired data, processes the data to decode and decompress it, and issues an appropriate response to the reader.

The directory memory may store compressed ZIP+4 Codes for five different types of postal addresses. These include general delivery, postmaster, post office box, rural route (including highway contract) and street. For each of these address types, there is a predetermined sequence of queries which are issued by the reader, and for each of the queries the directory controller executes a corresponding process and returns a corresponding response. The particular sequence of queries issued by the reader depends upon the type of size address on the mailpiece which the reader is processing, and will be described later.

In the automatic sorting of mail, multiline optical character readers function generally in the following manner. As each mailpiece flows through the reader, it is scanned, as by using a charged-coupled image scanner, to produce an analog image of the mailpiece. The analog image is then digitized and processed to isolate address information. Lines may be identified, formatted into blocks, and processed to identify characters. The reader may employ different types of character recognition processes and make a decision based upon the combined results of these processes. Word boundaries may be identified, and each word may be classified as alphabetic, numeric, mixed or special. Each line may then be subjected to format analysis to categorize the line as a city/state/ZIP line, a street address (or other type of postal address) line, a name line, or a line with no applicable address information. The results of these processes may then be stored for generating queries and for comparison with data included with responses. Multiline readers capable of performing these functions and manufactured by a number of different companies, including ELSAG of Italy, NEC of Japan, AEG-Telefunken of West Germany, and Recognition Equipment, Inc. of the U.S.

For the automatic sorting of mail, it is desired to process 12 mailpieces each second to obtain ZIP+4 add-on's, and to bar code the nine-digit ZIP+4 Code onto the mailpiece so that it may be sorted using bar code scanners. As will be appreciated, this requires rather fast access to the data stored in the directory memory, which precludes the use of mass data storage mediums such as magnetic tape, hard magnetic disks, or optical disks. To support the required data access times, a semiconductor memory is necessary. Access times of 200 nsec. are readily available with semiconductor RAM, which is more than adequate to provide the required data access time. However, it would be impractical to implement a 1,30 megabyte memory in semiconductor RAM, which is the size which would be necessary to store the ZIP+4 National source data file. Moreover, this source data file is a flat file. Although there is an inherent hierarchy based on geography in the data, the source file does not have a hierarchical organization, except to the extent that records are accessed by ZIP Code. This means that in order to retrieve the add-on for a particular address within a postal zone, it would be necessary to sort through a large number of data records in order to find the one of interest. This is very inefficient.

In order to avoid these difficulties, the invention compresses the source data file to a size of approximately 42 megabytes, which is a more reasonable size for storage in semiconductor RAM, and in a way which achieves high coding efficiencies and fast data retrieval while preserving full information content of the source data. Although the manner in which this is accomplished will be described in detail shortly, a brief overview will first be presented to facilitate a better understanding of the invention.

Broadly, the invention involves a data organization and data structures which take advantage of a natural hierarchy inherent in postal addressing in order to reduce redundancy in the source data, and encoding and decoding processes which reflect characteristics and relationships which exist in the source data and the manner in which add-on's were assigned. The replication of the add-on code assignment process in the compressed directory and in the decompression processes performed by the directory controller permit high coding efficiency and rapid code retrieval, and coding processes are optimized specifically for the source data on which they act and for the retrieval being performed. Additionally, the hierarchical organization of the directory makes multiple uses of the postal address elements that are stored only once. The data organization and structures and processes employed by the invention afford approximately a 97% reduction in data storage requirements.

Although the original source data is sorted by ZIP Code and to some extent within each ZIP Code by address type, the file is thereafter basically flat, meaning that it does not have a well defined hierarchical organization. One of the first things that was done in order to construct the compressed data directory was to resort the original source data into its natural hierarchical organization. For example, street addresses were first sorted alphabetically by primary street name and then in increasing numerical order of address number ranges. Rural route addresses were sorted first by route number and then by box number in increasing numeric order; post office box addresses were similarly sorted in increasing numeric and alphabetic order. Resorting was advantageous since it allowed, in some cases, several individual source data records to be combined into a single compressed data record, as will be described later. This permitted, for instance, 17 million source data street address records to be reduced to about 11 million compressed S records. In addition, the source data was analyzed to determine and recover things such as the processes by which urban planners and the like assigned postal address numbers, the processes by which ZIP+4 Codes were assigned, and to characterize relationships between elements of postal address records and between different records. Statistical analysis performed on the source data included counts, tabulations, histograms and samples; identified address formats and types; and described distributions, cross correlations and classifications of data elements as well as the functions of these elements. The results of the analysis were used in designing the directory data structures and the coding and retrieval processes. To the extent that any similarities and bias in the data could be determined and quantified, they offered the potential for data compression and were considered in tailoring the data structures and processes to the source data.

A significant aspect of the invention is the use of attribute modeling and coding to compress source data records. As will be described in more detail below, this involves defining for certain types of postal addresses a set of attributes which designate generally characteristics of source data, e.g., format, and relationships between data elements or data records. Each attribute is associated with a predetermined set of rules, each of which defines more specifically the particular characteristic or relationship represented by that attribute. The particular rule of each set which is used is indicated by the value of its corresponding attribute. In some instances, a rule itself expresses a particular characteristic or relationship directly. In other instances, a rule may be used with another value referred to as a "modifier value" in order to determine a particular quantity. A compressed data record is then formed by concatenating an identifier field, which consists of a representation of the tuple of the attribute values for the particular record, and a modifier field which gives the modifier values to be used by the rules specified by the attribute values. The tuple of attribute values may then be assigned a variable length Huffman code, which is stored in place of the tuple with the modifier values to form the compressed record.

Attribute coding is advantageous for compressing records which involve ranges of values, as is characteristic of postal address records where a particular add-on or a range of add-on's are assigned to a given range of postal addresses. It is often more efficient from a data compression standpoint to specify a range value as a function of another range value rather than explicitly giving the values of the range, particularly where this may be done with a small number of different functions. For example, a sequence of successive records may cover the ranges 400–499, 500–599, 600–699, etc. Since each range is the same and the low range value of each record is one greater than the high range value of its preceding record, only two functions or rules are necessary to completely specify the actual numerical values of each range when the records are decoded sequentially since the low range value of each record can be calculated from the high range value of the preceding record, and the high range value of the record can be calculated from the low range value of the same record. For this simple example, two attributes can be defined, one which relates to the computation of the low range value and one which relates to the computation of the high range value. This simple example also illustrates the advantages of the hierarchical data organization employed by the invention where records are organized in increasing numeric order since this simplifies the computational rules for determining the values of one record from those of another. The advantages of attribute coding for compressing data will become more apparent from the description which follows.

As noted above, the invention operates in response to queries from the multiline reader to provide ZIP+4 add-on's for five different types of postal addresses. For each type of postal address, the reader issues a predetermined sequence of queries which result in the directory controller executing a corresponding sequence of processes and providing corresponding responses back to the reader. These will be described in detail shortly for each of the five different types of postal addresses. First, however, the structure of the directory memory will be described. Many of the terms used hereinafter are defined in the appended Glossary, and reference should be had to this Glossary to facilitate a better understanding of the invention from the description which follows.

I. Directory Memory Structure

Figure 2:
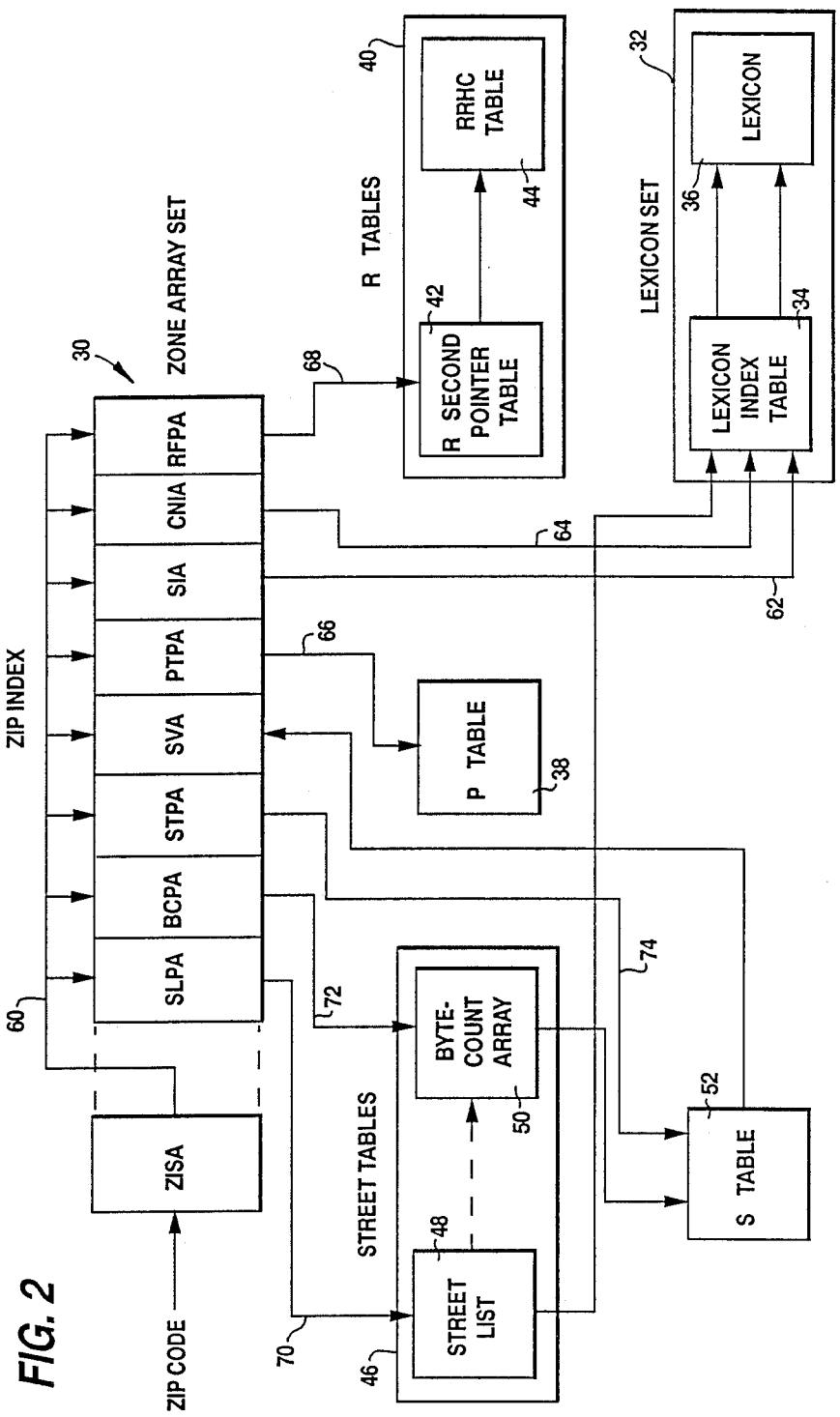
FIG. 2 is a block diagram of a directory memory structure in accordance with the invention.

FIG. 2 illustrates in block diagram form the structure of directory memory 14. The directory memory comprises seventeen separate structures which are linked by memory address components to form a hierarchical structure. Each individual structure stores all directory information from particular fields of source file records in a specified sequence. As shown in the figure, the directory memory comprises a Zone Array Set 30, which may include 9 different data arrays containing information used for retrieving data for each postal zone, a Lexicon Set 32 comprising a Lexicon Index Table 34 and a Lexicon 36, a P Table 38, R Tables 40 comprising an R Second Pointer Table 42 and an RRHC Table 44, Street Tables 46 comprising a Street List 48 and a Byte-Count Array 50, and a S Table 52.

1. The Zone Array Set

Figure 3:
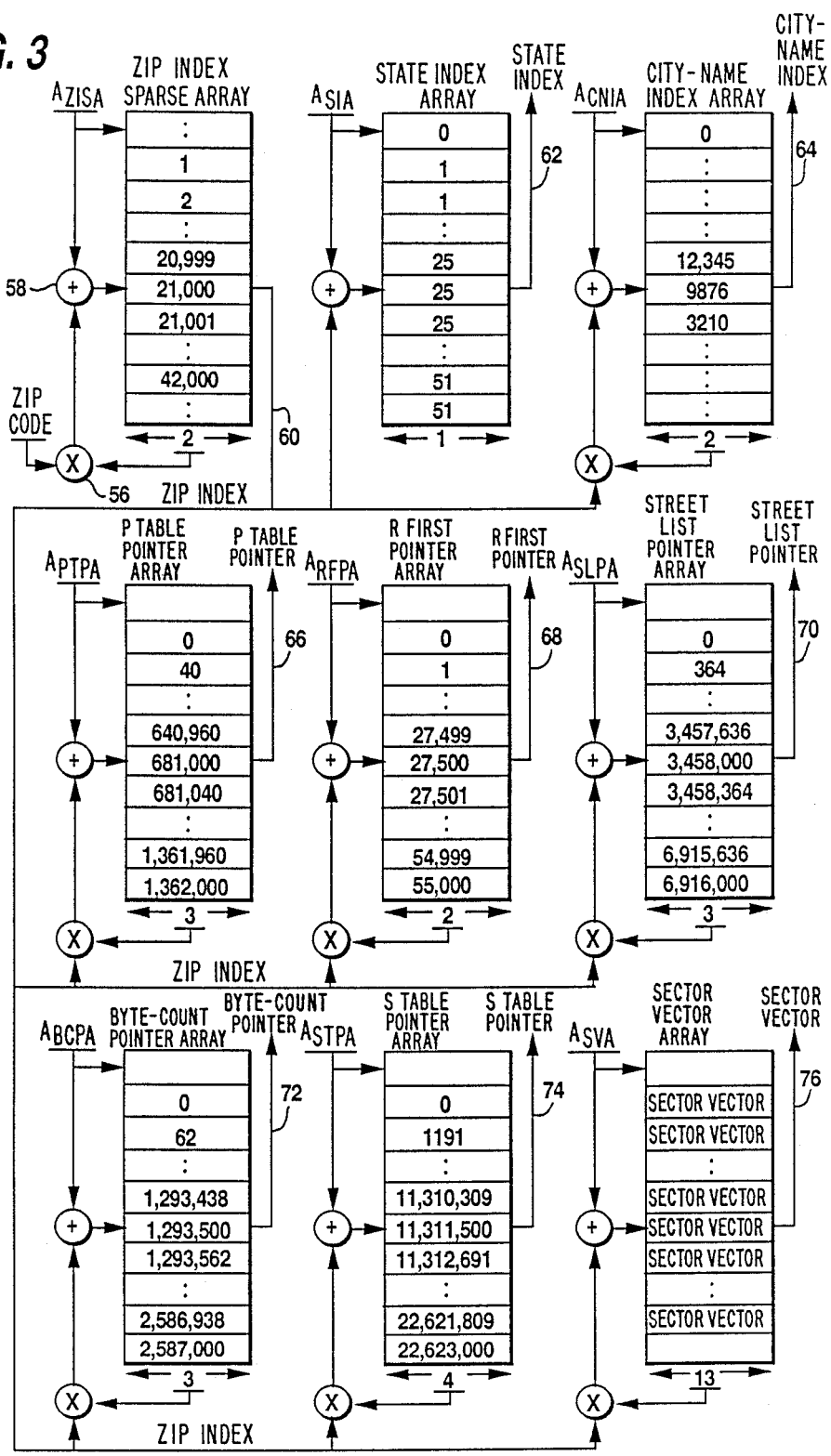
FIG. 3 illustrates a Zone Array Set of the directory memory of FIG. 2.

The Zone Array Set 30 is illustrated in more detail in FIG. 3. As shown, the array comprises nine one-dimensional data arrays which may include a Zip Index Sparse Array, a State Index Array, a City-Name Index Array, a P Table Pointer Array, a R First Pointer Array, a Street List Pointer Array, a Byte-Count Pointer Array, an S Table Pointer Array, and a Sector Vector Array.

The following notation is used in FIG. 3, as well as in connection with many of the other figures. Each horizontal block of an array corresponds to an element or a record, and the numbers within the blocks designate the value of the record. The numerals at the bottom of each array indicate the width of the array in the number of bytes each record contains. The notation at the upper left of each array, such as $A_{zisa}$ for the Zip Index Sparse Array, refers to the base address of the array, i.e., the memory address of the first record of the array. This is used for indexing or addressing the array, as will be described shortly.

The Zip Index Sparse Array is used for converting a ZIP Code into a Zip Index, which in turn is used for accessing the other arrays. The Zip Index Sparse Array has a length of 100,000 elements (to accommodate all possible five-digit numbers) but contains only approximately 42,000 Zip Indexes which correspond to the postal zones which have assigned ZIP Codes. The remaining 58,000 elements of the array which correspond to five-digit numbers which do not represent assigned ZIP Codes contain error codes such as all zeros. In order to obtain a Zip Index, the five-digit ZIP Code is first converted to a 17-bit number which is multiplied in a multiplier 56 by 2 (the byte width of the Zip Index Sparse Array) and added in an adder 58 to the base address of the Zip Index Sparse Array. This accesses the corresponding Zip Index, which is output on a line 60.

The remaining eight arrays are all 42,000 elements long and may be considered to be an eight-column table which is accessed by the Zip Index. The various arrays store memory address components in the form of indexes and pointers, and postal address information in the form of vectors.

The State Index Array is a one-byte wide array which contains approximately 42,000 State Name Indexes, one for each Zip Index, which point to 51 locations in the Lexicon Index Table. The State Index is output on a line 62. Many of the records in this array are duplicated since each state covers more than one postal zone. The City-Name Index Array likewise contains approximately 42,000 City-Name Indexes that point to locations in the Lexicon Index Table and which are output on a line 64.

The P Table Pointer Array is a 3-byte wide array which contains approximately 34,000 pointers to locations in the P Table (corresponding to the number of postal zones which have post office boxes). The P Table Pointers are provided on an output line 66. The R First Pointer Array is a 2-byte wide array containing approximately 18,000 pointers to locations in the R Second Pointer Table (corresponding to the postal zones which have rural routes). The R First Pointers are output on a line 68. The Street List Pointer Array is a 3-byte wide array that contains approximately 19,000 pointers to locations in the Street List and which are output on a line 70.

The Byte-Count Pointer Array contains 19,000 pointers to locations in the Byte-Count Array 50 of the Street Tables which are output on a line 72; the S Table Pointer Array is a 4-byte wide array containing 19,000 pointers to locations in the S Table which are output on a line 74; and the Sector Vector Array is a 13-byte wide array which contains approximately 34,000 Sector Vectors output on a line 76. Sector Vectors are used in add-on sector computations for general delivery, postmaster and street addresses. Each of the least significant 100 bits of a 104-bit Sector Vector indicates whether the sector it represents contains at least one ZIP+4 street record assignment, and bits 100-103 contain the add-on's for general delivery and postmaster addresses as follows:

If bit 100=1, the add-on for postmaster is 9999.
If bit 101=1, the add-on for postmaster is 9998.
If bit 102=1, the add-on for general delivery is 9999.
If bit 103=1, the add-on for general delivery is 9998.

These are the only add-on values that are used for postmaster and general delivery addresses.

An indexing technique similar to that described above for the Zip Index Sparse Array is used for addressing each of the other eight arrays. In each case, the Zip Index is multiplied by the width in bytes of the array and the product is added to the base address of the array to obtain the address of the first byte of the record of interest. Once the ZIP Code is converted to a Zip Index, the ZIP Code is no longer used. Instead, the Zip Index is used for addressing the arrays and is also returned to the reader as part of Response 1 (to be described shortly) where it is stored by the reader and subsequently returned to the directory controller as part of other queries.

2. The Lexicon Set

The Lexicon Set 32 comprising the Lexicon Index Table 34 and the Lexicon 36 is shown in more detail in FIG. 4. The Lexicon Index Table is a 4-byte wide flat file (as indicated in the figure) comprising a plurality of records that are used to access the Lexicon. The records contain memory address components that locate Lexicon character strings, define the assemblage of strings into words and names, and specify the relations of aliases to names.

The Lexicon Index Table comprises three contiguous sections: a 524,288-record section containing all street names, a 131,072-record section containing all city names, and a 256-record section containing all state names, which gives a table length of approximately 656,000.

The street name section comprises two subsections, a common name subsection followed by an uncommon name subsection. The common name subsection has a length of 32,768 locations and contains a record having all zeros in the first four locations, parent records for the most common 8,191 street names in every fourth location starting with the fifth location from the beginning, and 24,573 alias records in the remaining locations. The uncommon name subsection has 491,520 locations containing parent and alias records for the remaining street names.

As indicated in FIG. 4, an index is used to access the Lexicon Index Table. This index may be either an 11-bit Index of Street Name, a 19-bit Index of Street Name, a City-Name Index, a State Name Index, or a Table Index. This index is converted to a scaled index by multiplying it by 4 (the byte width of the table), and by a scale factor which may be 1 or 4, as shown at 80. The scaled index is then summed with a section offset and the base address of the table as shown in 82 to produce the physical address of the first byte of the corresponding table record.

A scale factor of 4 is used when accessing the Lexicon Index Table by an 11-bit Index of Street Name or a Table Index, and a scale factor of 1 is used otherwise. A section offset of 2,097,152 is used when accessing the table by City-Name Index in order to provide access to the city-name section of the table; similarly, a section offset of 2,621,440 is used when accessing the table by State Name Index in order to provide access to the state name section; a section offset of zero is used otherwise to provide access to the street name section.

The Lexicon 36 is a one-dimensional 1-byte wide array of characters that are stored as strings and which comprise words and word fragments. Each Lexicon entry is one character, and the array has a length of approximately 966,000 records.

The Lexicon Index Table may include a number of different types of records which specify different ways of assembling the character strings in the Lexicon into words and names. FIG. 5 illustrates five different types of records which the Lexicon Index Table may include. These are designated Type 0, 4, 5, 6 or 7. Each record is 32 bits long and comprises several different fields. The record type is designated by a 3-bit field comprising bits 29-31.

A Type 0 record accesses the Lexicon directly. It comprises four fields: the 3-bit record type field containing the bit pattern 000, a 3-bit alias count field (bits 26-28) indicating the number of alias records that follow, a 5-bit character count field (bits 21-25) that specifies the byte length of the Lexicon string, and a 21-bit Lexicon displacement field (bits 0-20) that indicates the byte address of the first character of the string relative to the base address of the Lexicon.

In order to access the Lexicon, the Lexicon displacement field of the record is added, as indicated at 84 in FIG. 4, to the base address $A_{lex}$ of the Lexicon to obtain the Lexicon address of the first character of the string.

Each Type 4, 5, 6, and 7 record accesses two other Lexicon Index Table records and thereby links strings together to form one word or name. Each record contains four fields. The 3-bit record type field (bits 29-31) contains the bit pattern 100, 101, 110, or 111 indicating record Types 4, 5, 6 or 7, respectively. The 3-bit alias count field (bits 26-28) indicates the number of alias records that follow. The 13-bit First Table Index field (bits 13-25) locates the target record for the first string relative to the beginning of the same table section. The 13-bit Second Table Index field (bits 0-12) performs the same function for the second string. Both target records lie at locations divisible by 4 within the same section, and the manner in which the strings are linked is determined by the record type in the following manner:

| Record Type | String Linkage |
| --- | --- |
| 4 | Concatenation |
| 5 | Space |

| Record Type | String Linkage |
|---|---|
| 6 | Hyphen |
| 7 | Space, Ampersand, Space |

The two Lexicon Table Index records accessed by each of record Types 4, 5, 6, and 7 may be records such as Type 0 records which access the Lexicon directly or they may be other Type 4, 5, 6 or 7 records. The advantage of using different types of records in the Lexicon Index Table is that it allows the size of the Lexicon to be reduced significantly since it allows words and names to be assembled from strings which are shorter than and fewer in number than words and names. Moreover, many names are formed by combining other names or common words or common character strings. If the Lexicon included an entire set of street, city and state names without any compression, it would require approximately 3.3 megabytes of storage. By storing character strings and using different types of Lexicon Index Table records to specify the assemblage of the character strings into words and names, as just described, the size of the Lexicon may be reduced to less than 1 megabyte, as indicated in FIG. 4. As will be appreciated, record types other than those illustrated in FIG. 5 may be included in the Lexicon Index Table.

In order to assemble a sequence comprising a name and its aliases, the number of successive Lexicon Index Table records following a given record which are indicated by the alias count field are successively accessed and the corresponding character strings defined by each record are obtained from the Lexicon. Delimiter characters may be used between names and aliases to separate them.

3. The P Table

Figure 6:
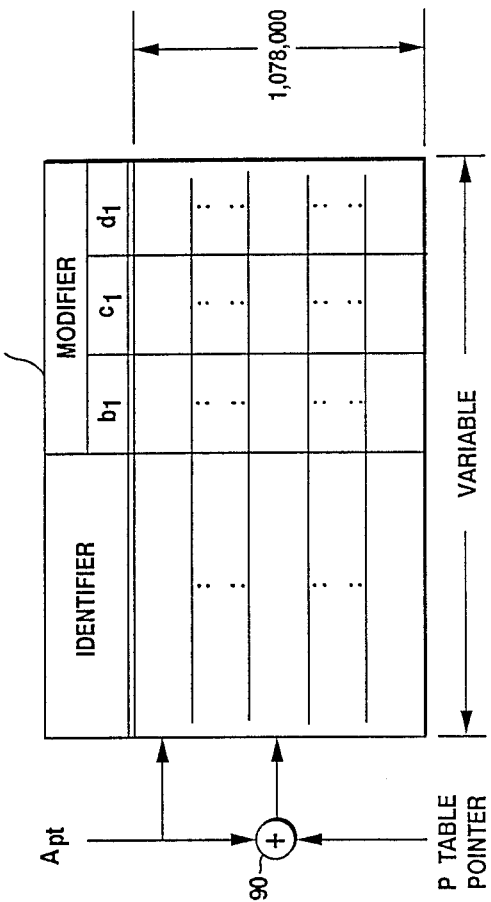
FIG. 6 illustrates a P Table of the directory memory of FIG. 2.

The P Table 38 of FIG. 2 stores, in compressed form, post office box numbers with their assigned add-on's. FIG. 6 illustrates the structure of the P Table and the format of its records. The table comprises a sequence of approximately 34,000 P files, one for each postal zone which has post office boxes. Each P file comprises a concatenation of variable length P records, and each P record comprises a concatenation of an identifier field and a modifier field, as indicated in FIG. 6. Each P file begins on a byte boundary, and unused bits at the ends of the files are set to 1. As shown in the figure, there are approximately 1,078,000 P records.

The data in the P Table is accessed by means of P Table Pointers from the P Table Pointer Array of FIG. 3. Two pointers are required in order to identify the beginning and end of a particular P file. Referring to FIG. 3, when the P Table Pointer Array is addressed by the Zip Index (by multiplying the Zip Index by 3 and adding the result to the base address of the P Table Pointer Array) a First P Table pointer is accessed. This first pointer is then added as indicated at 90 in FIG. 6 to the base address $A_{pt}$ of the P Table to produce the address of the beginning of the P file which corresponds to that Zip Index. This is the byte address which is multiplied by 8 to obtain the bit address of the first bit of the first P record of that file. The end of the file is determined by accessing the next record of the P Table Pointer Array (for the next higher Zip Index) to produce a Second P Table Pointer which, in turn, is used to determine the address of the beginning of the next P file. By converting to a bit address by multiplying by 8 and then subtracting 1 from this address, the address of the last bit of that P file is determined.

The P records for a particular Zip Index are stored in the corresponding P file in the P Table in sorted numerical and alphabetical order, for reasons which will become apparent shortly, and each P record specifies a range of box numbers and a corresponding range of add-on's. As will be described in more detail in connection with Process P2, the add-on for a particular box is retrieved by successively decoding each P record starting at the beginning of the corresponding P file, and comparing the box number with the range specified by each successive record until either a match is found, or the lower limit of the range is determined to exceed the read box number, or the end of the file as specified by the ending address of the last bit is reached.

Attribute coding is employed for compressing portions of P.O. Box source records into compressed P Table records. This is accomplished by defining for P.O. Box source data records four attributes which are designated A, B, C, and D, respectively. As previously described, each attribute represents either a characteristic of a source data record or a relationship either between elements of a source data record or between source data records. Attributes A, B, C, and D have corresponding attribute values designated by a, b, c, d, respectively. For each attribute, a predetermined set of rules is defined which specify the nature of the characteristic or relationship represented by that attribute, and the attribute value specifies which of the rules of that set is to be used to determine the characteristic or relationship for a given record. The set of attribute values comprises a 4-tuple $\{a,b,c,d\}$. The identifier field of each P record in the P Table comprises a prefix code that specifies a particular 4-tuple which is applicable to that record. Preferably, this code is a variable length Huffman code, for reasons to be described shortly.

As also noted above, for some attributes the particular rule designated by the corresponding attribute value specifies directly a characteristic or relationship. In other cases, the designated rule must use other values which are referred to herein as modifier values. In general, for each set of attribute values a, b, c, d, there is a corresponding set of modifier values $a_1$, $b_1$, $c_1$, and $d_1$ which provide the values required by the rules designated by the attribute values. In the case of P Table records, a modifier value $a_1$ is not necessary (because of the definition of Attribute A given below). Modifier values are necessary, however, in general for Attributes B, C and D. As indicated in FIG. 6, the modifier field of each P Table record comprises a concatenation of subfields. The contents of these subfields specify the modifier values $b_1$, $c_1$, and $d_1$, respectively. In some cases, one or more of the modifier values may be null, i.e., not present, in which case the corresponding subfield would not exist in the record. Also, in some cases the entire modifier field may be null, in which case the identifier comprises the entire record.

The definitions of the attributes for post office box records are as follows:

| Attribute A: Format for RANGELOW and RANGEHIGH | | | |
|---|---|---|---|
| Attribute Value a | Format | | Variable K |
| 0 | Unchanged | | Unchanged |
| 1 | Changed XN | XN2A | Changed 1,024 1 |
| Attribute B: Computation of RANGELOW | | | |

-continued

| Attribute Value b | Computation of RANGELOW | Range of Differential | $b_1$ Bits |
|---|---|---|---|
| 0 | RANGEHIGH + K | 1 | 0 |
| 1 | RANGEHIGH + K ($b_1$ + 2) | 2 to 17 | 4 |
| 2 | RANGEHIGH + K ($b_1$ + 18) | 18 to 81 | 6 |
| 3 | $b_1$ | — | 32 |

Attribute C: Computation of RANGEHIGH

| Attribute Value c | Computation of RANGEHIGH | Range of Differential | $c_1$ Bits |
|---|---|---|---|
| 0 | RANGELOW | 0 | 0 |
| 1 | RANGELOW + K ($c_1$ + 1) | 1 to 2 | 1 |
| 2 | RANGELOW + K ($c_1$ + 3) | 3 to 10 | 3 |
| 3 | RANGELOW + K ($c_1$ + 11) | 11 to 266 | 8 |

Attribute D: Computation of Add-on

| Attribute Value d | Computation of Add-on | $d_1$ Bits |
|---|---|---|
| 0 | Last 4 BOX numerics | 0 |
| 1 | Last 3 BOX numerics | 0 |
| 2 | Last 2 BOX numerics | 0 |
| 3 | Last 3 BOX numerics + 1,000 $d_1$ | 4 |
| 4 | Last 2 BOX numerics + 100 $d_1$ | 7 |
| 5 | Last 2 BOX numerics + $d_1$ | 14 |
| 6 | ADDONHIGH + 1 + BOX − RANGELOW | 0 |
| 7 | BOX − RANGELOW + $d_1$ | 14 |
| 8 | ADDONHIGH + 1 | 0 |
| 9 | $d_1$ | 14 |

Figure 7:
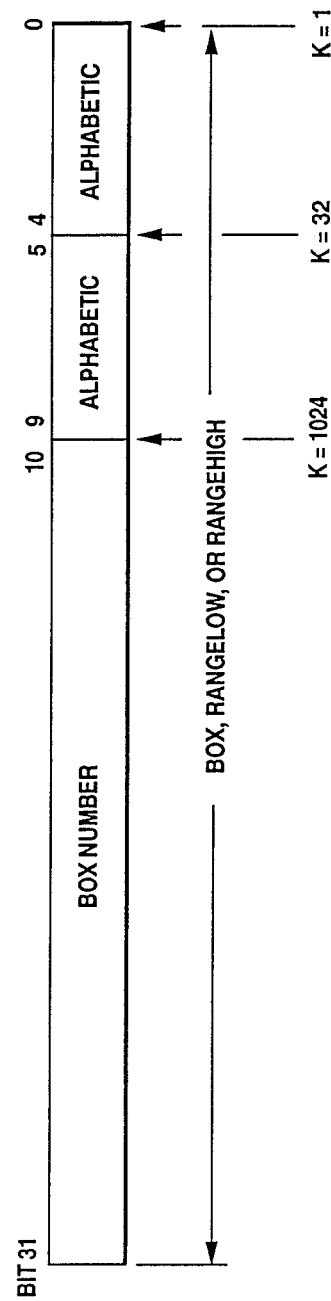
FIG. 7 illustrates a data format of post office box and rural route box records which is used in Processes P2 and R2.

Attribute A specifies the format of the low and the high values (referred to as RANGELOW and RANGEHIGH, respectively) of the P.O. Box range specified by the record. In general, P.O. Box record formats may be either all numerics, or a numeric followed by one or two alphabetics, or one or two alphabetics. The format of the stored forms of BOX and the decompressed range values RANGELOW and RANGEHIGH will always be the same, however; this format is illustrated in FIG. 7. BOX and the range values are specified by 32-bit numbers, bits 10-31 of which specify the numeric portion, and bits 0-4 and 5-9 of which comprise two fields representing two alphabetics. Alphabetics are right-justified and zero-filled on the left.

The variable K indicated in the definition of Attribute A is a variable which specifies the position of a moveable imaginary decimal point in the format of FIG. 7. If the value of K=1,024, the imaginary decimal point is positioned at bit 10, which is the position it would have if the range value comprised all numerics. In this position, if the range value is incremented by, for example, 1, only the numeric portion would be incremented. On the other hand, if K=1, the imaginary decimal point is positioned at bit 0, which is the position for a range value that includes numerics with trailing alphabetics or alphabetics alone. In this case, incrementing by 1 would increment the alphabetic portion, for example, from "B" to "C".

If attribute value a=0, the format is unchanged from the RANGEHIGH value of the previous record to the RANGELOW value for the current record. On the other hand, if a=1, the format toggles between an all numeric format (XN) and a format (designated XN2A) for one or two alphabetics with or without a preceding numeric part, and the value of K toggles between 1,024 and 1.

Attributes B and C specify, respectively, the manner of computing the RANGELOW and RANGEHIGH values for a record, and Attribute D specifies the manner of computing the add-on for a P.O. Box which falls within that range. The computational rules are similar to C programming language statements. In the definition of Attribute B, RANGEHIGH refers to the high range value of the previous record in the file, and RANGELOW for the current record is calculated from that value using one of the four rules listed as specified by attribute value b. If b=0, the current RANGELOW value is equal to the previous RANGEHIGH value incremented by K, as indicated in the column labeled "Range of Differential". Depending upon the value of K, this increments either the numeric or the alphabetic portion of the box number. Since this rule completely specifies the new RANGELOW value in terms of the previous RANGEHIGH value and K, no modifier value is necessary and the length of the $b_1$ subfield is 0, as indicated.

The relationship defined above for attribute value b=1 is used where the differential between the new RANGELOW and the previous RANGEHIGH is between 2 and 17. The relationship specified by b=2 is used where the differential is between 18 and 81. In each case, the modifier value $b_1$ is assigned a value such that the corresponding relationship gives the actual value of the differential. In the first case, $b_1$ has a value between 0 and 15, which is specified in the $b_1$ modifier subfield using 4 bits. In the second case, $b_1$ has a value between 0 and 63 and is specified in the modifier subfield using 6 bits.

For b=3, modifier value $b_1$ specifies the value of RANGELOW explicitly in a subfield having a length of 32 bits. By properly sorting the source data records in increasing order, most of the cases are covered by the first three relationships specified by attribute values 0, 1 and 2.

The RANGEHIGH for a particular record is computed from RANGELOW for that record in a similar manner using one of the relationships specified under the definition of Attribute C, by the value of c.

The add-on corresponding to a given P.O. Box number is computed using one of the ten rules specified in the definition of attribute D above. The first three rules corresponding to attribute values d=0, 1 and 2 cover the very common situations where the add-on corresponds to the last four, three or two numerics of the box number. The rule specified by d=3 covers the situation where, for example, box numbers in the range 2,000-3,000 are assigned add-on's in the range 4,000-5,000. In this case, modifier value $d_1$ is the difference in the thousandth place between the box number and the add-on. In this example, it is 2. The rule specified by an attribute value of 4 is similar and is used where the add-on and the box number are the same in the last two digits and may differ in the thousandth and hundredth places.

The rule specified by value d=5 is used where the last two digits of the add-on are the same as the box number and the first two digits differ by some offset specified by modifier value $d_1$.

The rule specified by value d=6 is used where the add-on is computed from a high range value of an add-on range of a previous record, the box number, and the low range value of the current record.

The rule specified by value d=7 computes the add-on in terms of the box number, the RANGELOW value of the current record, and some offset specified by modifier value $d_1$.

The rule specified by value d=8 assigns an add-on that is one greater than the high range add-on value of the preceding record; and the last rule is used for giving the add-on explicitly.

The operation of the above rules may be illustrated by the following example. Assume the following sequence of records:

| Record | Box No. Range | | Add-on Range | |
|---|---|---|---|---|
| | Low | High | Low | High |
| i | 1 | 500 | 0001 | 0500 |
| i + 1 | 518 | 519 | 0618 | 0619 |
| i + 2 | B | B | 0502 | 0502 |
| i + 3 | C | E | 0503 | 0505 |

For the record i+1, the 4-tuple {a,b,c,d} of attribute values would be {0, 2, 1, 4} and the corresponding modifier values would be:

$b_1 = 000000$ (value=0)
$c_1 = 0$ (value=0)
$d_1 = 00000000000001$ (value=1)

Attribute value a=0 since the format does not change between records. Attribute value b=2 since the differential between the previous Box No. Range High of record i and the current Box No. Range Low of record i+1 is 18. Modifier value $b_1 = 0$ since the rule specified by b=2 begins at a differential of 18. Attribute value c=1 since the Range High (519) is 1 greater than the Range Low (518) and $c_1 = 0$. Attribute value d=4 and modifier value $d_1 = 1$ since the add-on range 0618–0619 differs from the Add-on Range High of record i (500) by 1 in the hundredth place.

For record i+2, the attribute values would be {1, 1, 0, 9}, and the corresponding modifier values would be:

$b_1 = 0000$ (value=0)
$c_1 =$ null
$d_1 =$ a 32-bit number = 502

Attribute value a=1 since the format changed from numeric to alphabetic. Upon changing formats, the previous RANGELOW and RANGEHIGH values are set to 0. Thus, values b=1 and $b_1 = 0$ in order to increment RANGELOW by 2 (from 0 to B). Value c=0 since the Box No. Range values RANGELOW and RANGEHIGH are the same, and $c_1 =$ null; and value d=9 since it is necessary to give the add-on explicitly. This is done by assigning the 32-bit number $d_1$ the value of 502.

For record i+3, the attribute values would be {0, 0, 1, 6}, and the modifier values would be:

$b_1 =$ null
$c_1 = 1$ (value=1)
$d_1 =$ null

Attribute value a=0 since the format does not change. Attribute value b=0 since the Box No. Range Low of record i+3 is 1 greater than the Box No. Range High of record i+2, and $b_1 =$ null since it is not needed. Attribute value c=1 and modifier value $c_1 = 1$ since the Box No. Range High of record i+3 is 2 greater than the Box No. Range Low of the record. And, attribute value d=6 and modifier value $d_1 =$ null since the add-on for a box in the range C-E is 1 greater than the Add-on High of record i+2 plus the difference between the box (BOX) and the Box No. Range Low value (RANGE-LOW) for record i+3. Thus, Box C would have the add-on 0503, Box D would have the add-on 0504, and Box E would have the add-on 0505.

In assigning an attribute value in a case where more than one of the set of rules for that attribute could be used to specify the relationship, it is preferable to select the rule which produces the shortest compressed record, i.e., the one that results in the shortest modifier field.

From the foregoing, the significant advantages of attribute coding to data compression are apparent. Instead of storing source data, attribute coding allows sets of rather simple rules which specify the characteristics and relationships between elements of data records to be used for reconstructing the source data. It is only necessary to store codes which specify the particular rules to be used and, in some instances, values to be used with the rules. By sorting the source data records in increasing numeric and alphabetic order, it becomes possible to combine source data records into a single compressed data record and also simplifies the rules which are used for reconstructing the source data.

For the P Table attributes defined above, there are 320 different 4-tuples which are possible, and these occur with different frequencies. Rather than storing the actual values of the tuples in the identifier fields of the P records, it is preferable to assign each tuple a variable length Huffman code and store the Huffman code in the identifier field. As is well known, the length of a Huffman code is inversely proportional to the logarithm of its probability of occurrence. By assigning the shortest length Huffman codes to the most frequently occurring tuples, the average number of bits required for the identifier fields can be reduced to approximately 4 bits. If the tuple values were stored directly, 9 bits would be required for each field. A more detailed description of attribute coding and the manner in which it operates will be given later in connection with Process P2.

4. The R Tables

Figure 8:
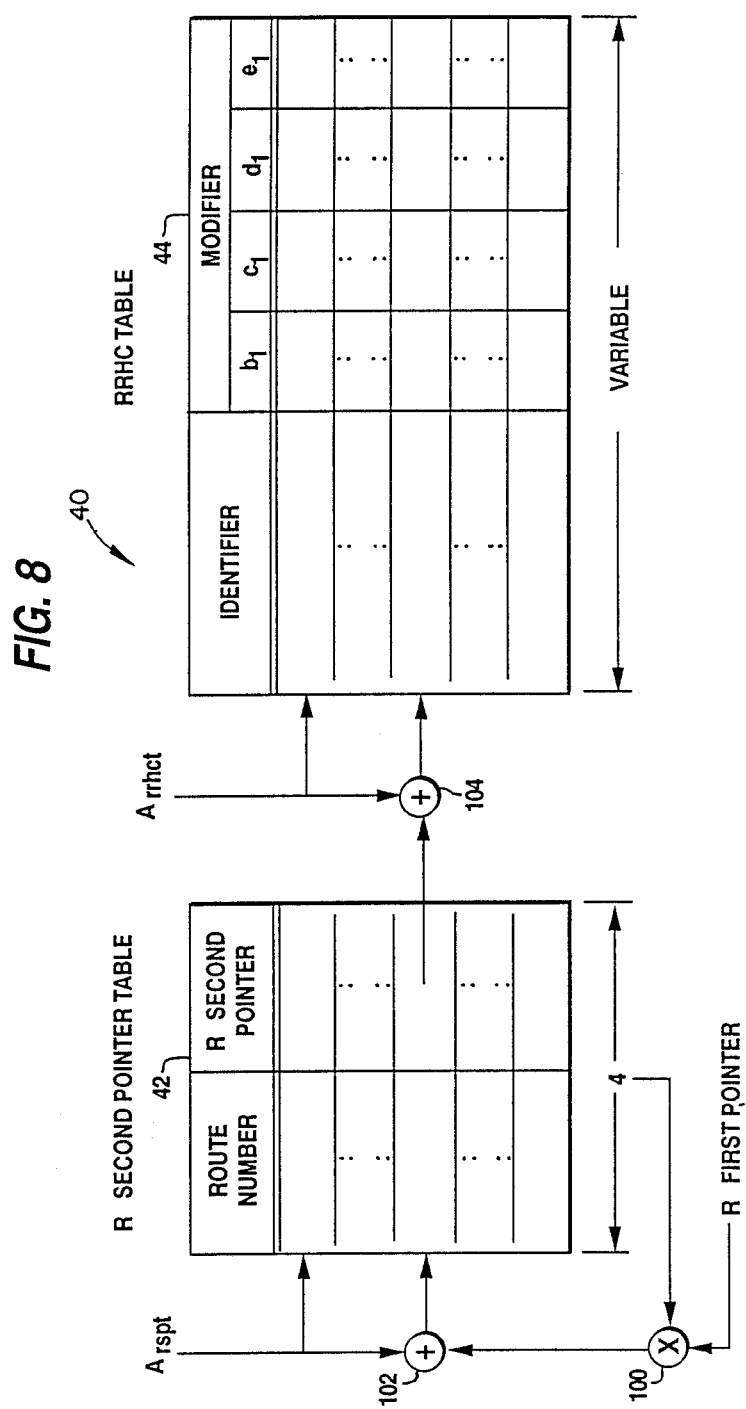
FIG. 8 illustrates the R Tables of the directory memory of FIG. 2.

FIG. 8 illustrates in more detail the structures of the R Tables 40 comprising the R Second Pointer Table 42 and the RRHC Table 44. The R Second Pointer Table comprises a sequence of 18,000 files comprising approximately 55,000 R Second Pointer records, each of which comprises two fixed length fields which specify a route number and an R Second Pointer. The route number field may be 1 byte wide, and the R Second Pointer field 3 bytes wide. The most significant bit of the route number field indicates a rural route when it is set to a 1 and a highway contract route when it is set to a 0. The seven least significant bits specify the route number itself in the range 0-99. The R Second Pointer field gives the byte displacement into the RRHC Table at which the route's first RRHC record begins.

As with the P Tables, two indexes into the R Second Pointer Table are required to specify the beginning and ending addresses of a file corresponding to a particular Zip Index. To determine the beginning address, the Zip Index is used to access a R First Pointer from the R First Pointer Array of FIG. 3 by multiplying the Zip Index by 2 (the byte width of the array) and adding the result to the base address of the array. The R First Pointer so obtained is then multiplied by 4 as indicated at 100 in FIG. 8 and added to the base address of the R Second Pointer Table at 102 to provide the beginning address of the file corresponding to that Zip Index. The ending address of the file is determined in a similar way by deriving another R First Pointer from the next record in the R First Pointer Array corresponding to the next Zip Index, and taking the difference between the two pointers. An R Second Pointer derived from the R Second Pointer Table is added at 104 to the base address of the RRHC Table to indicate the displacement into the Table at which corresponding RRHC records are found.

The RRHC Table 44 comprises a sequence of 55,000 RRHC files, one for each rural and highway contract route. Each file comprises a concatenation of variable length RRHC records, begins on a byte boundary, and is padded with ones at its end. Each RRHC record corresponds to one rural route or highway contract record from the source file.

Attribute coding is also used for RRHC Table records, except that five attributes are used for these records rather than four as was done with P records. As shown in FIG. 8, each RRHC record comprises an identifier field which is used for storing a prefix code that specifies a 5-tuple {a,b,c,d,e}, and a modifier field comprising a concatenation of subfields which store modifier values $b_1$, $c_1$, $d_1$, and $e_1$ for use in the rules specified by the attribute values in the tuple. One or more of the modifier values may be null in which case its corresponding subfield would not exist. If all of the modifier values are null, the record comprises only the identifier.

For RRHC records, five attributes are employed as just noted. These are designated A, B, C, D, and E. Although the first four designations are the same as those used for P records, the RRHC record attributes have different definitions as follows:

| Attribute A: Formats of RANGELOW AND RANGEHIGH | | | | |
|---|---|---|---|---|
| Attribute Value a | RANGELOW Format | Variable $K_l$ | RANGEHIGH Format | Variable $K_h$ |
| 0 | XN | 1,024 | XN | 1,024 |
| 1 | XN | 1,024 | XN1A | 32 |
| 2 | XN | 1,024 | XN2A | 1 |
| 3 | XN1A | 32 | XN | 1,024 |
| 4 | XN1A | 32 | XN1A | 32 |
| 5 | XN1A | 32 | XN2A | 1 |
| 6 | XN2A | 1 | XN | 1,024 |
| 7 | XN2A | 1 | XN1A | 32 |
| 8 | XN2A | 1 | XN2A | 1 |

| Attribute B: Computation of RANGELOW | | | |
|---|---|---|---|
| Attribute Value b | Computation of RANGELOW | Range of Differential | $b_1$ Bits |
| 0 | RANGEHIGH + $K_l$ | 1 | 0 |
| 1 | RANGEHIGH + $K_l (b_1 + 2)$ | 2 to 5 | 2 |
| 2 | RANGEHIGH + $K_l (b_1 + 6)$ | 6 to 69 | 6 |
| 3 | $b_1$ | — | 32 |

| Attribute C: Computation of RANGEHIGH | | | |
|---|---|---|---|
| Attribute Value c | Computation of RANGEHIGH | Range of Differential | $c_1$ Bits |
| 0 | RANGELOW | 0 | 0 |
| 1 | RANGELOW + $K_h$ | 1 | 0 |
| 2 | RANGELOW + $K_h (c_1 + 2)$ | 2 to 5 | 2 |
| 3 | RANGELOW + $K_h (c_1 + 6)$ | 6 to 69 | 6 |

| Attribute D: Computation of SECTOR | | |
|---|---|---|
| Attribute Value d | Computation of SECTOR | $d_1$ Bits |
| 0 | SECTOR | 0 |
| 1 | SECTOR + 1 | 0 |
| 2 | SECTOR − 1 | 0 |
| 3 | $d_1$ | 7 |

| Attribute E: Computation of SEGMENT | | |
|---|---|---|
| Attribute Value e | Computation of SEGMENT | Range of Change | $e_1$ Bits |
| 0 | SEGMENT | 0 | 0 |
| 1 | SEGMENT + 1 | +1 | 0 |
| 2 | SEGMENT − 1 | −1 | 0 |
| 3 | SEGMENT + $(e_1 + 2)$ | +2 to +5 | 2 |
| 4 | SEGMENT − $(e_1 + 2)$ | −2 to −5 | 2 |
| 5 | SEGMENT + $(e_1 + 6)$ | +6 to +21 | 4 |
| 6 | SEGMENT − $(e_1 + 6)$ | −6 to −21 | 4 |
| 7 | $e_1$ | — | 7 |

A somewhat greater variance in format is encountered in RRHC records than was the case with P records. Accordingly, greater format agility is required and this is reflected in the definition of Attribute A above. Attribute values a=0, 1 and 2 are used in cases where the format for RANGELOW is numeric and the format for RANGEHIGH is either numeric, numeric with one alphabetic, or numeric with two alphabetics, respectively. Values 3, 4 and 5 cover situations where the format for RANGELOW is numeric with a single alphabetic and the format for RANGEHIGH is either numeric, numeric with a single alphabetic, or numeric with a double alphabetic, respectively; and values 6, 7 and 8 cover situations where the format for RANGELOW is numeric with two alphabetics and the format for RANGEHIGH is either numeric, numeric with a single alphabetic, or numeric with two alphabetics, respectively.

In order to handle the various combinations of formats for RANGELOW and RANGEHIGH, two different variables $K_l$ and $K_n$ are employed. Each may take on three values 1, 32, or 1,024 and may be visualized as moveable decimal points. The format used for storing values of BOX, RANGELOW, and RANGEHIGH for RRHC records is similar to that for P records and is illustrated in FIG. 7. The difference is that for P records alphabetics are right-justified and zero-filled on the left, whereas for RRHC records alphabetics are left-justified and zero-filled on the right. A K-value of 32 places a decimal point at bit 5.

The rules for computing RANGELOW and RANGEHIGH, which are specified by Attributes B and C, respectively, are similar to the rules used for P records and they operate in generally the same way. Accordingly, further description is unnecessary.

Attributes D and E define rules for computing the sector and the segment values of the add-on's. It will be recalled that the sector portion of the add-on is the first two digits and the segment portion is the last two digits. In these rules, the variable SECTOR and SEGMENT refer to the sector and segment, respectively, of the previous record. Accordingly, attribute values d=0, 1 and 2 respectively mean that the sector value for the current record is either the same as the previous record or is increased or decreased by 1. If d=3, the sector is given explicitly by the modified value $d_1$.

For computing the segment, the first three rules of Attribute E respectively mean that the segment value for the current record is either the same as the previous record or is one greater or not less than the previous record. The rules corresponding to values e=3, 4, 5, and 6 calculate the current segment value as a function of the previous segment value and offsets specified by the modifier value $e_1$. The last rule gives the segment value explicitly as the value of modifier $e_1$.

There are 4,608 possible 5-tuples of attribute values for RRHC records. Each is assigned a 16-bit code. Also, the more common tuples are preferably assigned variable length Huffman codes with the most common tuples being assigned the shortest Huffman codes. The corresponding Huffman code for each record may be stored in the identifier field in place of the tuple. A more detailed description of the actual structure of each record will be discussed in connection with Process R2 later.

5. The Street Tables

Figure 9:
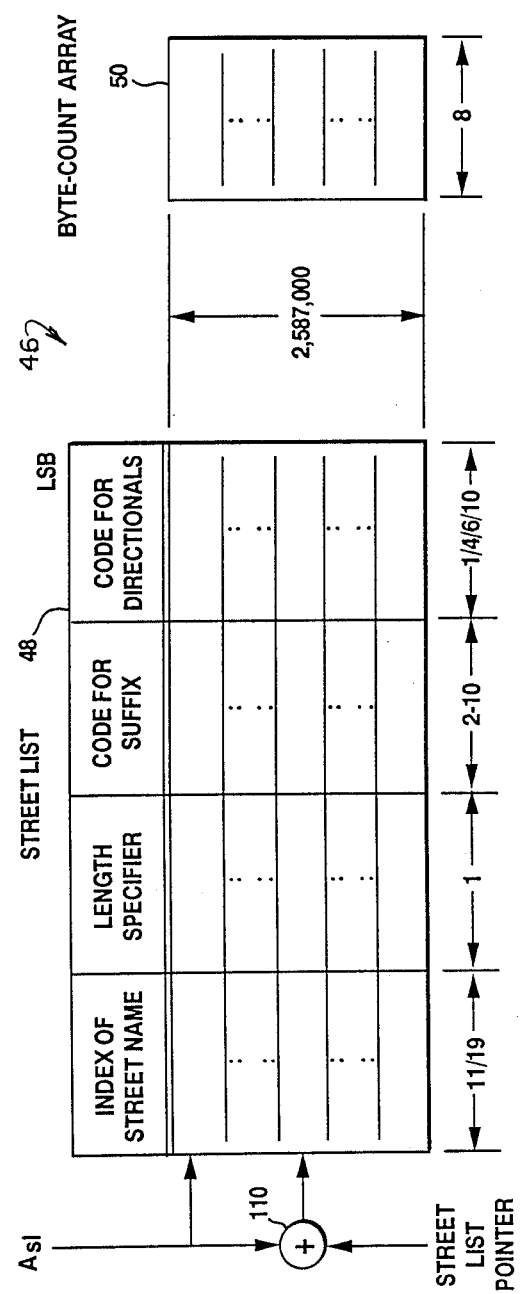
FIG. 9 illustrates the Street Tables of the directory memory of FIG. 2.

FIG. 9 illustrates the structure of the Street Tables 46 that store the full street names and related memory addresses in the Street List 48 and in the Byte-Count Array 50. The Street List stores codes corresponding to the four components of full street names, i.e., street names, predirectionals, postdirectionals, and suffixes. The Byte-Count Array stores memory address components used for accessing the S Table. Each Byte-Count Array entry corresponds to one Street List record. The Street List is accessed by a Street List Pointer obtained from the Street List Pointer Array (FIG. 3), and the Byte-Count Array is accessed by a Byte-Count Pointer obtained from the Byte-Count Pointer Array (FIG. 3) and a Street Index, a number which is supplied by the optical character reader. The records in both structures are stored in order of increasing ZIP Code.

The Street List comprises a sequence of approximately 19,000 street files (corresponding to the number of the 42,000 postal zones which have streets). Each street file comprises a concatenation of Street List records, each of which comprises a concatenation of three variable length and one fixed length fields as shown in FIG. 9. (In the figure, the field widths of the Street List and Byte-Count Array are given in bits, rather than in bytes.) Street files begin on byte boundaries, and unused bits at the ends of files are set to 0. The three variable length fields store an index of a street name, a code for a suffix, and a code for directionals, respectively. The fixed length field is a 1-bit field that stores a Length Specified for the Index of Street Name. Individual Street List records are concatenated, and alternate Street List records, which contain alternate names for streets known by more than one name, immediately follow their parent records. In the United States, there are approximately 2.587 million streets. The Street List stores a record for each. The Byte-Count Array comprises a sequence of approximately 2.587 million Byte counts which give the size of the corresponding street subsections of the S Table 52.

The Index of Street Name in the first field of each record of the Street List comprises either an 11- or a 19-bit code. The index points to a location within the Lexicon Index Table at which the record for the name assigned to the index is stored. The Indexes of Street Names are akin to Huffman codes in that the most common 2,048 street names are assigned 11-bit indexes, and the remainder are assigned 19-bit indexes. The index relates to the proper name used in a full street name. For example, in the full street name "N. Capitol Street SW", "Capitol" is the street name. The predirectional is "N", the postdirectional is "SW", and the suffix is "Street".

The second field is the Length Specifier which when 0 indicates the Index of Street Name is 11 bits long and when 1 indicates the index is 19 bits long.

The third field of each Street List record stores the Code for Suffix. There are approximately 150 different suffixes in use. Each is assigned a variable length code between 2 and 10 bits. The codes assigned to the nineteen most common suffixes range in length from 2 to 9 bits, and the remaining suffixes are assigned 10-bit codes. The leading bit of a code may occupy the least significant bit of the field. The following Tables 1 and 2 illustrate possible code assignments for suffixes. The codes in Table 1 are shown in binary form, and those in Table 2 are shown in hexadecimal form.

TABLE 1
Binary Codes for Most Common Suffixes

| Suffix | Binary Code | Suffix | Binary Code | Suffix | Binary Code |
|---|---|---|---|---|---|
| ST | 00 | PL | 11001 | PKY | 110111011 |
| DR | 010 | CIR | 110100 | HWY | 110111100 |
| RD | 011 | WAY | 110101 | PARK | 110111101 |
| AVE | 100 | BLVD | 1101100 | SQ | 110111110 |
| CT | 1010 | TER | 1101101 | LOOP | 110111111 |
| LN | 1011 | TRL | 11011100 | | |
| (None) | 11000 | CV | 110111010 | | |

TABLE 2
Hexadecimal Codes for Least Common Suffixes

| Suffix | Code | Suffix | Code | Suffix | Code | Suffix | Code |
|---|---|---|---|---|---|---|---|
| PLZ | 380 | FWY | 3A0 | KY | 3C0 | CPE | 3E0 |
| EXT | 381 | GDNS | 3A1 | RNCH | 3C1 | FRY | 3E1 |
| ALY | 382 | KNLS | 3A2 | CLB | 3C2 | MT | 3E2 |
| PT | 383 | OVAL | 3A3 | STRA | 3C3 | PLNS | 3E3 |
| RUN | 384 | BYP | 3A4 | VIA | 3C4 | PRT | 3E4 |
| TRCE | 385 | IS | 3A5 | ML | 3C5 | RST | 3E5 |
| PIKE | 386 | EXPY | 3A6 | FLS | 3C6 | WLS | 3E6 |
| PATH | 387 | SPUR | 3A7 | BRG | 3C7 | FLDS | 3E7 |
| HTS | 388 | MDWS | 3A8 | FRK | 3C8 | FT | 3E8 |
| RDG | 389 | VLY | 3A9 | SHR | 3C9 | FL | 3E9 |
| HL | 38A | LK | 3AA | SMT | 3CA | FRD | 3EA |
| EST | 38B | BLF | 3AB | TRAK | 3CB | NCK | 3EB |
| CTR | 38C | CTS | 3AC | CORS | 3CC | PR | 3EC |
| ROW | 38D | FRST | 3AD | RIV | 3CD | SHLS | 3ED |
| VLG | 38E | BCH | 3AE | SPG | 3CE | TRLR | 3EE |
| WALK | 38F | STA | 3AF | LKS | 3CF | BTM | 3EF |
| MALL | 390 | PNES | 3B0 | DV | 3D0 | DM | 3F0 |
| PASS | 391 | BR | 3B1 | INLT | 3D1 | LGT | 3F1 |
| MNR | 392 | SHRS | 3B2 | CLFS | 3D2 | MLS | 3F2 |
| CRES | 393 | CYN | 3B3 | DL | 3D3 | UN | 3F3 |
| BND | 394 | COR | 3B4 | JCT | 3D4 | ISS | 3F4 |
| HOLW | 395 | ISLE | 3B5 | GTWY | 3D5 | LF | 3F5 |
| GLN | 396 | BRK | 3B6 | LDG | 3D6 | BG | 3F6 |
| VIS | 397 | SPGS | 3B7 | VL | 3D7 | FRKS | 3F7 |
| VW | 398 | HVN | 3B8 | CP | 3D8 | LCKS | 3F8 |
| TPKE | 399 | HBR | 3B9 | FLT | 3D9 | MSN | 3F9 |
| XING | 39A | ANX | 3BA | FRG | 3DA | RPDS | 3FA |
| LNDG | 39B | FLD | 3BB | STRM | 3DB | SHL | 3FB |
| GRN | 39C | MTN | 3BC | ORCH | 3DC | TUNL | 3FC |
| HLS | 39D | ARC | 3BD | PLN | 3DD | | |
| CRK | 39E | CRSE | 3BE | RADL | 3DE | | |
| GRV | 39F | CSWY | 3BF | BYU | 3DF | | |

The last field of each record stores a 1-, 4-, 6-, or 10-bit prefix code assigned to a combination of predirectional and postdirectional. There are nine different predirectionals and nine different postdirectionals giving a total of 81 possible combinations. Some combinations are more common than others and are assigned shorter length codes. FIG. 10 is a table which illustrates a possible set of code assignments for combinations of directionals. The codes are illustrated in binary form, and the leading bit of a code (shown on the left in FIG. 10) may occupy the least significant bit of the field.

The Byte Count Array contains three different types of entries, i.e., "standard" entries, "zero" entries, and "special" entries.

Standard entries in the Byte-Count Array 50 are 8-bit integers in the range 1–127 expressing the size of the corresponding S street subsection in bytes. Zero entries contain 8 zeros, and are stored in Byte-Count Array locations corresponding to alternate Street List records. Special entries occur in pairs and provide a method of sorting byte counts greater than 127. The low-ordered special entry has bit 7 set to 1 and contains the seven least significant bits of the byte-count. The high-ordered special entry has bit 7 set to 1, contains the most significant seven bits of the byte-count, and follows the low-ordered entry. A dummy record is inserted in the Street List at the location corresponding to the high-ordered special entry.

Street List records are accessed by adding the Street List Pointer from the Street List Pointer Array, as shown in FIG. 9 at 110, to the base address $A_{sl}$ of the Street List to obtain the address of the first record of the zone corresponding to the Zip Index. Starting at that address, records are then successively decoded to assemble a list of full street names for that zone. The Byte-Count Pointer Array determines the number of records to be decoded. This will be described in more detail shortly in connection with Process S2.

6. The S Table

FIG. 11 illustrates the structure of the S Table 52 which stores the assignments of segments to street numbers and, together with the Sector Vector Array of FIG. 3, the assignments of sectors. The S Table is accessed by the S Table Pointer and the byte-counts from the Byte-Count Array. The S records stored in the S Table are sorted by ZIP Code, by full street name, then numerically.

The S Table comprises a sequence of approximately 19,000 S zone sections or files, each of which comprises a sequence of S street subsections. There are an average of 136 subsections per section, one per full street name. Each S street subsection comprises a concatenation of variable length S records, typically six records per subsection. There are approximately 12.277 million S records.

As indicated in FIG. 11, each S record comprises a concatenation of an identifier field and a modifier field comprising a concatenation of subfields, each of which comprises a sequence of bits. Zone sections and street subsections begin on byte boundaries, and unused bits at the end of subsections are set to 1. Individual S records are concatenated to form street subsections.

In order to access the first S record for a desired street, the S Table Pointer for a zone corresponding to the Zip Index is obtained from the S Table Pointer Array (FIG. 3). This is then added to the base address $A_{st}$ of the S Table, as shown at 120 in FIG. 11. The result is the address of the first S record for the first street listed for that zone. In order to obtain the address of the first S record for any desired street in a particular zone, a sum of byte counts is computed; e.g., for the 33rd street in the zone, the zone's S Table Pointer is added to the sum of the first 32 byte counts stored in the section of the Byte-Count Array for the zone, as shown at 122, for the corresponding section of the S Table. The result is the address of the first S record of the desired street in the zone, e.g., the 33rd street.

The identifier field of an S Table record comprises a code that specifies one 6-tuple {a,b,c,d,e,f} of attribute values for six different attributes as defined below. Each 6-tuple may be assigned as many as ten different codes, one of 24 bits and as many as nine Huffman codes of 10 bits or less, one Huffman code for each of the nine values of STATUS, which is a variable that specifies the degree to which S records within a street block have at that time been decoded. STATUS is computed by sequentially decoding S records. STATUS is useful for data compression since it enables shorter Huffman codes to be used for common tuples. As each S record is decoded, the value of STATUS is updated in accordance with the degree to which the assignments of add-on's to addresses within the street block have been decoded. The following Table 3 is an example of a set of conditions which may be used for defining the value of STATUS. In the Table, "Even Side" and "Odd Side" refer, respectively, to the even-numbered and odd-numbered sides of a street block.

TABLE 3
Computation of STATUS

| STATUS | Interpretation | |
|---|---|---|
| | Even Side | Odd Side |
| 0 | Not decoded | Not decoded |
| 1 | Partially decoded | Not decoded |
| 2 | Fully decoded | Not decoded |
| 3 | Not decoded | Partially decoded |
| 4 | Partially decoded | Partially decoded |
| 5 | Fully decoded | Partially decoded |
| 6 | Not decoded | Fully decoded |
| 7 | Partially decoded | Fully decoded |
| 8 | Fully decoded | Fully decoded |

The modifier field of the S Table contains the values of modifiers $a_1$–$f_1$ which are used in the rules specified by the attribute values a–f of corresponding attributes A–F which are defined below. Although the designations, A, B, etc., of the attributes are the same as those which were used previously, the attributes for the S Table have different definitions.

Attribute A: Computation of BLOCK

| Attribute Value a | Computation of BLOCK | Range of Increment | $a_1$ Bits |
|---|---|---|---|
| 0 | BLOCK | 0 | 0 |
| 1 | BLOCK + 1 | 1 | 0 |
| 2 | BLOCK + $a_1$ + 2 | 2 to 3 | 1 |
| 3 | BLOCK + $a_1$ + 4 | 4 to 7 | 2 |
| 4 | BLOCK + $a_1$ + 8 | 8 to 15 | 3 |
| 5 | BLOCK + $a_1$ + 16 | 16 to 31 | 4 |
| 6 | BLOCK + $a_1$ + 32 | 32 to 63 | 5 |
| 7 | BLOCK + $a_1$ + 64 | 64 to 127 | 6 |
| 8 | BLOCK + $a_1$ + 128 | 128 to 255 | 7 |
| 9 | $a_1$ | 0 to 16,383 | 14 |

Attribute B: Computation of LOW

| Attribute Value b | Computation of LOW | $b_1$ Bits |
|---|---|---|
| 0 | 0 | 0 |
| 1 | HIGH + 1 | 0 |
| 2 | HIGH' + 1 | 0 |
| 3 | $b_1$ | 7 |

Attribute C: Computation of HIGH

| Attribute Value c | Computation of HIGH | Range of HIGH − LOW | $c_1$ Bits |
|---|---|---|---|
| 0 | 99 | — | 0 |
| 1 | LOW | 0 | 0 |
| 2 | LOW + $2c_1$ + 1 | 1,3,5,7 | 2 |
| 3 | LOW + $2c_1$ + 2 | 2,4,6,8 | 2 |
| 4 | LOW + $2c_1$ + 9 | 9,11, . . . ,39 | 4 |
| 5 | LOW + $2c_1$ + 10 | 10,12, . . . ,40 | 4 |
| 6 | $c_1$ | 0 to 99 | 7 |

Attribute D: Computation of Sector Index

| Attribute Value d | Computation of $I_{sec}$ | Range of Change | $d_1$ Bits |
|---|---|---|---|
| 0 | $I_{sec}$ | 0 | 0 |
| 1 | $I_{sec}$ + 1 | +1 | 0 |
| 2 | $I_{sec}$ − 1 | −1 | 0 |
| 3 | $I_{sec}$ + $d_1$ + 2 | +2 to +3 | 1 |
| 4 | $I_{sec}$ − $d_1$ − 2 | −2 to −3 | 1 |
| 5 | $I_{sec}$ + $d_1$ + 4 | +4 to +7 | 2 |
| 6 | $I_{sec}$ − $d_1$ − 4 | −4 to −7 | 2 |
| 7 | $I_{sec}$ + $d_1$ + 8 | +8 to +23 | 4 |
| 8 | $I_{sec}$ − $d_1$ − 8 | −8 to −23 | 4 |
| 9 | $d_1$ | — | 7 |

-continued

Attribute E: Computation of SEG

| Attribute Value e | Computation of SEG | Range of Change | $e_1$ Bits |
|---|---|---|---|
| 0 | SEG | 0 | 0 |
| 1 | H {SEGEVEN, SEGODD} + 1 | — | 0 |
| 2 | L {SEGEVEN, SEGODD} − 1 | — | 0 |
| 3 | SEG + $e_1$ + 2 | +2 to +3 | 1 |
| 4 | SEG − $e_1$ − 2 | −2 to −3 | 1 |
| 5 | SEG + $e_1$ + 4 | +4 to +7 | 2 |
| 6 | SEG − $e_1$ − 4 | −4 to −7 | 2 |
| 7 | SEG + $e_1$ + 8 | +8 to +23 | 4 |
| 8 | SEG − $e_1$ − 8 | −8 to −23 | 4 |
| 9 | $e_1$ | — | 7 |

Attribute F: Street Number Parity and Segment Computation

| Attribute Value f | Parity | Computation of SEGEVEN | Computation of SEGODD | $f_1$ Bits |
|---|---|---|---|---|
| 0 | Even | SEG | — | 0 |
| 1 | Odd | — | SEG | 0 |
| 2 | Both | SEG | SEG | 0 |
| 3 | Both | SEG | SEG + 1 | 0 |
| 4 | Both | SEG | SEG − 1 | 0 |
| 5 | Both | SEG | SEG + $f_1$ + 1 | 2 |
| 6 | Both | SEG | SEG − $f_1$ − 1 | 2 |
| 7 | Both | SEG | SEG + $f_1$ + 5 | 4 |
| 8 | Both | SEG | SEG − $f_1$ − 5 | 4 |
| 9 | Both | SEG | $f_1$ | 7 |

The format of the S Table records is generally similar to that previously described for P records and RRHC records in that each record relates to a numerical range of street addresses, and the record specifies the corresponding add-on's in terms of computational rules for all addresses within the range. In the definition of Attribute A above, BLOCK refers to the block number (all but the last two digits of a street address or house number; e.g., BLOCK is "12" for the address "1234 Main St.") of the previous record, and the various rules corresponding to attribute values a=0 to 9 specify the manner of computing the block number for the current record. Records do not cross blocks so that the block number will be the same for both the low and high values of the range specified in the record. The rules for computing BLOCK operate in a manner similar to that previously described. In some cases, (values 0 and 1) the current block number is specified directly without the need for an al modifier value. In other cases (values 2–8) a modifier value al from the corresponding subfield of the record is used to compute the block number; and in the last case (value 9) the modifier gives the block number explicitly.

Attributes B and C specify the rules for computing the last two digits of the low end and high end, respectively, of the street address range of the record. The low end of the range of a record comprises the block number (BLOCK) computed by Attribute A concatenated with the value of LOW computed by the rules set forth in the definition of Attribute B. The high end of the range comprises BLOCK concatenated with the value of HIGH computed by the rules defined by Attribute C.

In the definition of Attribute B, HIGH refers to the last two digits of the high range values specified by the previous record, and HIGH' refers to a previous value of HIGH that is temporarily stored, as will be described in more detail in connection with Process 3 below. LOW for the current record is therefore computed as a function of the HIGH value of a previous record or, in some instances, a modifier value $b_1$. On the other hand, the last two digits of the high end of the range of the current record (HIGH) are computed using the rules specified in the definition of Attribute C using the just computed value of LOW and, in some instances, a modifier value $c_1$. Again, the operation of these rules is generally self explanatory. For attribute value c=0, the high end of the range is simply set to "99" which is a very common occurrence. For c=1, the low and high ends of a range are the same. The rules specified by attribute values 2 and 4 are used for odd-numbered ranges, while those specified by attribute values 3 and 5 are for even-numbered ranges. For attribute value 6, the value of modifier value $c_1$ gives the high end of the range explicitly.

The rules set forth in the definition of Attribute D are used for computing the Sector Index ($I_{sec}$) for the current record as a function of the Sector Index of the previous record. The Sector Index is a quantity used to retrieve a corresponding sector number from the Sector Vector using indirection, the Sector Vector being a bit map embodiment of an Index Table storing a sector value for each index value. The sector is equal to the bit position (0–99) in the Sector Vector for the zone of the last of the number of 1's in the Sector Vector specified by Isec. If $I_{sec}=5$ and the fifth 1 is in bit position 9, for example, the sector is 09. There is an implied rule in the assignment of add-on's that the sector is the same between odd- and even-numbered street addresses within the same range, which simplifies the computation of the sector.

The operation of the rules specified under the definition of Attribute D for computing Sector Index will be readily apparent from the previous description and need not be explained in detail. The first rule for value 0 is used where the Sector Index does not change from the previous record; the next two rules are used where the Sector Index either increases or decreases by 1; and the remaining rules use a modifier value $d_1$ contained in the appropriate subfield of the record for calculating the Sector Index.

The method of assigning add-on's to street addresses often enables two source records to be combined into one compressed S record. In order to combine source records, two conditions are necessary. First, the low and high range values for one source record may differ from corresponding values of the other source record by no more than 1; and, second, the sector values of the add-on's for the two source records must be the same. Where possible, two source records are preferably combined into one compressed S record.

The rules specified in the definition of Attribute E relate to the computation of an intermediate value SEG which is used with a rule specified under the definition of Attribute F for computing the segment values (the last two digits of the add-on) for the even- and odd-numbered sides of a street. In Attribute F, these are referred to, respectively, as SEGEVEN and SEGODD. As with the ranges and Sector Indexes, the new value for SEG is computed from the previous values of SEG, SEGEVEN, and SEGODD in accordance with the rules specified above. Again, the operation of the rules is generally self explanatory except for perhaps those corresponding to attribute values e=1 and 2. These two computational rules respectively take the higher or the lower of the previous SEGEVEN and SEGODD values and add or subtract 1. This covers a very common situation which occurs in the assignment of add-on's. The remaining rules for attribute values 3–9 compute SEG as a function of the previous value of SEG and modifier value $e_1$.

The rules specified in the definition of Attribute F for computing the segment portion of the add-on are also generally self explanatory. The first two (corresponding to values 0 and 1) are used where there are no addresses and therefore no assigned add-on's on one side of a street. The rule specified by value f=2 is used where the segment values are the same on both sides of a street; and those specified by values 3 and 4 are used where the segment values differ by 1 on opposite sides of a street. The remaining rules are used for computing the segment as a function of SEG and the modifier value $f_1$.

From the foregoing description, the advantages of attribute coding for compression purposes become readily apparent. This technique conveniently enables the full information content of source data records to be specified in terms of rules which define the characteristics of the source data records and which relate elements of a source data record to elements of a previous record as well as to elements of the same record. By sorting the source data records and organizing them in a hierarchy and in increasing numeric or alphabetic order within the hierarchy, rather simple relationships can be defined that completely specify the full information content of one source data record from a previous record. Thus, by sequentially decoding the records, the source data can be readily reproduced. Attribute coding as described above, affords very significant data compression, particularly when used in conjunction with variable length Huffman coding. These techniques have permitted the approximately 1,300 megabytes of ZIP+4 National Directory source data to be compressed to approximately 42 megabytes, as previously indicated.

Having described the structure of the directory memory and the coding methods employed for compressing data, it is now appropriate to describe the processes performed by the directory controller to retrieve and decode the compressed records.

II. DIRECTORY CONTROLLER PROGRAM DATA STRUCTURES AND PROCESSES

As described above, the invention supports the retrieval of add-on's for five types of postal addresses. For each of these types, the reader 10 of FIG. 1 produces a predetermined sequence of queries, in response to which the directory controller executes a predetermined sequence of processes and returns a sequence of responses. The following Table 4 indicates these sequences of queries, processes and responses for each of the postal address types.

TABLE 4

| Address Type | Query-Response Sequence | Process Designation |
|---|---|---|
| General Delivery | Query 1 → Response 1 | Process 1 |
| | Query 2GD → Response 2GD | Process GD2 |
| Postmaster | Query 1 → Response 1 | Process 1 |
| | Query 2PM → Response 2PM | Process PM2 |
| Post Office Box | Query 1 → Response 1 | Process 1 |
| | Query 2P → Response 2P | Process P2 |
| Rural Route (includes highway contract route) | Query 1 → Response 1 | Process 1 |
| | Query 2R → Response 2R | Process R2 |
| Street | Query 1 → Response 1 | Process 1 |
| | Query 2S → Response 2S | Process S2 |

TABLE 4-continued

| Address Type | Query-Response Sequence | Process Designation |
|---|---|---|
| | Query 3 → Response 3 | Process 3 |

Each query may comprise a sequence of characters which include certain information and which cause the directory controller to execute a particular process which is designated by the query. Similarly, the responses provided by the directory controller may comprise another specified sequence of characters which identify the response and provide the results of the process. The forms of the queries and responses are not critical to the invention, nor for that matter are the particular sequences indicated above in Table 4. The sequences given above and the particular formats for the queries and responses which will be defined shortly are based upon the characteristics of typical multiline optical character readers. These are given here to afford a better understanding of the context and environment in which the invention may be used. It will be appreciated that the invention may be used with other types of data processing systems which employ other command and response formats. These may be easily accommodated by appropriate changes to the input and output modules of the directory controller in ways that are well known to those skilled in the art. It will be appreciated, for example, that the input to the directory controller may simply comprise formatted commands which are input through a computer keyboard to which the invention is interfaced, and the responses may likewise be formatted responses which the computer system recognizes and accepts.

For the multiline reader 10 of FIG. 1, the following gives the definitions and formats of an exemplary set of queries and responses.

Query 1—a sequence of seven characters: a special character identifying the beginning of Query 1, five characters representing the read ZIP Code in order of descending significance, and a special character identifying the end of Query 1.

Response 1—a sequence of a variable number of characters: a special character identifying the beginning of Response 1; the 2-byte ZIP Index, more significant byte first; an item-delimiter character; the state name and its aliases, each as a string and separated by alias-delimiter characters; an item-delimiter character; the city name(s) and their aliases, each as a string and separated by alias-delimiter characters; and a special character identifying the end of Response 1. The ZIP Index will indicate an error code if the directory controller determines that the 5-character sequence in Query 1 does not represent an assigned ZIP Code.

Query 2GD—a sequence of four characters: a special character identifying the beginning of Query 2GD; the ZIP Index, more significant byte first; and a special character identifying the end of Query 2GD.

Response 2GD—a sequence of six characters: a special character identifying the beginning of Response 2GD; the retrieved add-on sector, more significant byte first; the retrieved add-on segment, more significant byte first; and a special character identifying the end of Response 2GD. In case of retrieval failure, retrieved sector and segment characters will form an error code that indicates the type of failure.

Query 2PM—a sequence of four characters: a special character identifying the beginning of Query 2PM; the ZIP Index, more significant byte first; and a special character identifying the end of Query 2PM.

Response 2PM—a sequence of six characters: a special character identifying the beginning of Response 2PM; the retrieved add-on sector, more significant byte first; the retrieved add-on segment, more significant byte first; and a special character identifying the end of Response 2PM. In case of retrieval failure, retrieved sector and segment characters will form an error code that indicates the type of failure.

Query 2P—a sequence of fifteen characters: a special character identifying the beginning of Query 2P; the ZIP Index, more significant byte first; an item-delimiter character; the read post office box number as a 10-character sequence, right justified with zeros if wholly numeric (left justified with blank spaces otherwise), most significant byte first; and a special character identifying the end of Query 2P.

Response 2P—a sequence of six characters: a special character identifying the beginning of Response 2P; the retrieved add-on sector, more significant byte first; the retrieved add-on segment, more significant byte first; and a special character identifying the end of Response 2P. In case of retrieval failure, retrieved sector and segment characters will form an error code that indicates the type of failure.

Query 2R—a sequence of twenty characters: a special character identifying the beginning of Query 2R; the ZIP Index, more significant byte first; an item-delimiter character; the read route identifier as a 4-character sequence, most significant byte first; an item-delimiter character; the read box number as a 10-character sequence, right justified with zeroes if wholly numeric (left justified with blank spaces otherwise), most significant byte first; and a special character identifying the end of Query 2R.

Response 2R—a sequence of six characters: a special character identifying the beginning of Response 2R; the retrieved add-on sector, more significant byte first; the retrieved add-on segment, more significant byte first; and a special character identifying the end of Response 2R. In case of retrieval failure, retrieved sector and segment characters will form an error code that indicates the type of failure.

Query 2S—a sequence of four characters: a special character identifying the beginning of Query 2S; the ZIP Index, more significant byte first; and a special character identifying the end of Query 2S.

Response 2S—a sequence of a variable number characters. The first character will be a special character identifying the beginning of Response 2S. The next two characters will be the ZIP Index, more significant byte first. The next character will be an item-delimiter character. The next characters will represent a formatted list containing all full street names for the zone corresponding to the ZIP Index. Each item in the list will be followed by an item-delimiter character and will contain the four components of a full street name separated by component-delimiter characters. The components will be, in order, the predirectional, the name, the suffix, and the postdirectional. Each component may be null and may contain one or more aliases separated by alias-delimiter characters. The final character will be a special character identifying the end of Response 2S.

Query 3—a sequence of eighteen characters: a special character identifying the beginning of Query 3; the ZIP Index, more significant byte first; an item-delimiter character; the 2-byte Street Index, more significant byte first; an item-delimiter character; the read street number as a 10-character sequence, right justified with zeroes if wholly numeric (left justified with blank spaces otherwise), most significant byte first; and a special character identifying the end of Query 3.

Response 3—a sequence of six characters: a special character identifying the beginning of Response 3; the retrieved add-on sector, more significant byte first; the retrieved add-on segment, more significant byte first; and a special character identifying the end of Response 3. In case of retrieval failure, retrieved sector and segment characters will form an error code that indicates the type of failure.

The processes and program data structures employed by the directory controller are based upon the structure of the directory memory as described above. These will now be described.

1. Process 1

As indicated in Table 4, Process 1 is performed as the first process of the sequence of processes for retrieving the ZIP+4 add-on's for all of the postal address types. Broadly stated, the purpose of this process is to check the ZIP Code read by the reader for validity, determine the city names and state name assigned to that ZIP Code, and to return these names along with their aliases to the reader so that a comparison can be made by the reader between the city and state name it has read from the mailpiece with the retrieved names. If the reader finds that the names match (to a prescribed degree of precision which is established in the reader) the reader then generates a query which is appropriate for the type of postal address it has decided is on the mailpiece to retrieve the add-on. Otherwise, the mailpiece is assumed to have an incorrect address and is routed to an area for hand processing. Response 1, as indicated above, also includes the Zip Index which the reader stores and returns as part of the next query of the sequence.

More particularly, the steps performed by the directory controller for Process P1 are as follows:

1. Obtain the ZIP index:
A. Store the first special character defined by Response 1 in the buffer 22.
B. Convert the 5-character (40-bit) ZIP Code string in Query 1 to a 17-bit integer ZIP.
C. Retrieve the ZIP Index from the ZIP Index Sparse Array at location ($A_{zisa}+2\times ZIP$).
D. Store the ZIP Index in the buffer, followed by an item-delimiter character.

2. Obtain the state name and aliases:
A. Retrieve the State Index from the State Index Array at location ($A_{sia}+$ZIP Index).
B. Retrieve the Lexicon Index Table record at location ($A_{lit}+2,621,440+4\times$State Index).
C. Store the corresponding lexicon strings in the buffer, separated by alias-delimiter characters.
D. Store an item-delimiter character in the buffer.

3. Obtain the city name and aliases:
A. Retrieve the City-Name index from the City-Name Index Array at location ($A_{cnia}+2\times$ZIP Index).
B. Retrieve the Lexicon Index Table record at location ($A_{lit}+2,097,152+4\times$City-Name Index).

C. Store lexicon strings in the buffer, separated by alias-delimiter characters.

D. Store the second special character defined by Response 1 in the buffer.

4. Generate Response 1 by sending the buffer contents to the reader.

If the Zip Code included in Query 1 does not correspond to an actual ZIP Code, the Zip Index retrieved at step 1.C above will be an error code which will cause the process to terminate and a response will be returned which simply comprises the special characters and the error code.

When the directory controller generates a response, it clears its buffers and returns to a state at which it is awaiting a new query. It does not store any information produced during the just-completed process, such as the Zip Index, which is the reason that the Zip Index is included in all of the queries from the reader (except Query 1). The execution time of Process 1 is approximately 1 millisecond.

2. Process GD2

This process determines the add-on for a general delivery address. As previously noted the only add-on's used for general delivery addresses are 9998 and 9999. Accordingly, there are only three possible cases for the add-on, i.e., one of these two add-on's or "not assigned". The add-on is given directly by bits 6 and 7 of the last byte of the Sector Vector corresponding to the Zip Index. If bit 6 is set to a 1, the add-on is 9999. If bit 7 is set to a 1, the add-on is 9998. If neither bit is set, there is no assigned add-on and zeros are returned. The steps of Process GD2 are as follows:

1. Transfer the first special character defined by Response GD2 into the buffer 22.

2. Set a 32-bit variable ADDON to zero.

3. Retrieve the most significant byte of the Sector Vector from the Sector Vector Array at location $A_{sva} + 13 \times \text{ZIP Index} + 12$.

4. If bit 6 is set, set ADDON to $09090909_{16}$.

5. If bit 7 is set, set ADDON to $09090908_{16}$.

6. Transfer ADDON into the buffer.

7. Transfer the second special character of Response GD2 into the buffer.

8. Generate Response 2GD by sending the buffer contents to the reader.

The execution time of this process is estimated to be 1 millisecond.

3. Process PM2

This process determines the add-on for a postmaster address. As in the case of general delivery addresses, the only two possible add-ons are 9999 and 9998, and this process is substantially the same as Process GD2 except that bits 4 and 5 of the most significant byte of the Sector Vector are used to indicate the add-on. The following outlines the steps of this process:

1. Transfer the first special character defined by Response PM2 into the buffer 22.

2. Set a 32-bit variable ADDON to zero.

3. Retrieve the most significant byte of the Sector Vector from the Sector Vector Array at location $A_{sva} + 13 \times \text{ZIP Index} + 12$.

4. If bit 4 is set, set ADDON to $09090909_{16}$.

5. If bit 5 is set, set ADDON to $09090908_{16}$.

6. Transfer ADDON into the buffer.

7. Transfer the second special character into the buffer.

8. Generate Response 2PM by sending the buffer contents to the reader.

The execution time of Process PM2 is estimated to be 1 millisecond.

4. Process P2

Process P2 retrieves the add-on's for post office box numbers. This is accomplished by first formatting the post office box number read by the reader, which is a string of ten 8-bit characters included in Query 2P, as a 32-bit number (as shown in FIG. 7), successively decoding each of the P Table records starting with the first record for the zone indicated by the Zip Index which is stored at location ADDRESS pointed to by the P Table Pointer, comparing the decoded range of the record to the read box number, computing the add-on when a match is detected, and formatting and transferring the add-on to the buffer. If no match is detected, zeros are returned. The reason for formatting the box number as a 32-bit number is that this enables the microprocessor to make the comparisons very quickly.

Figure 12:
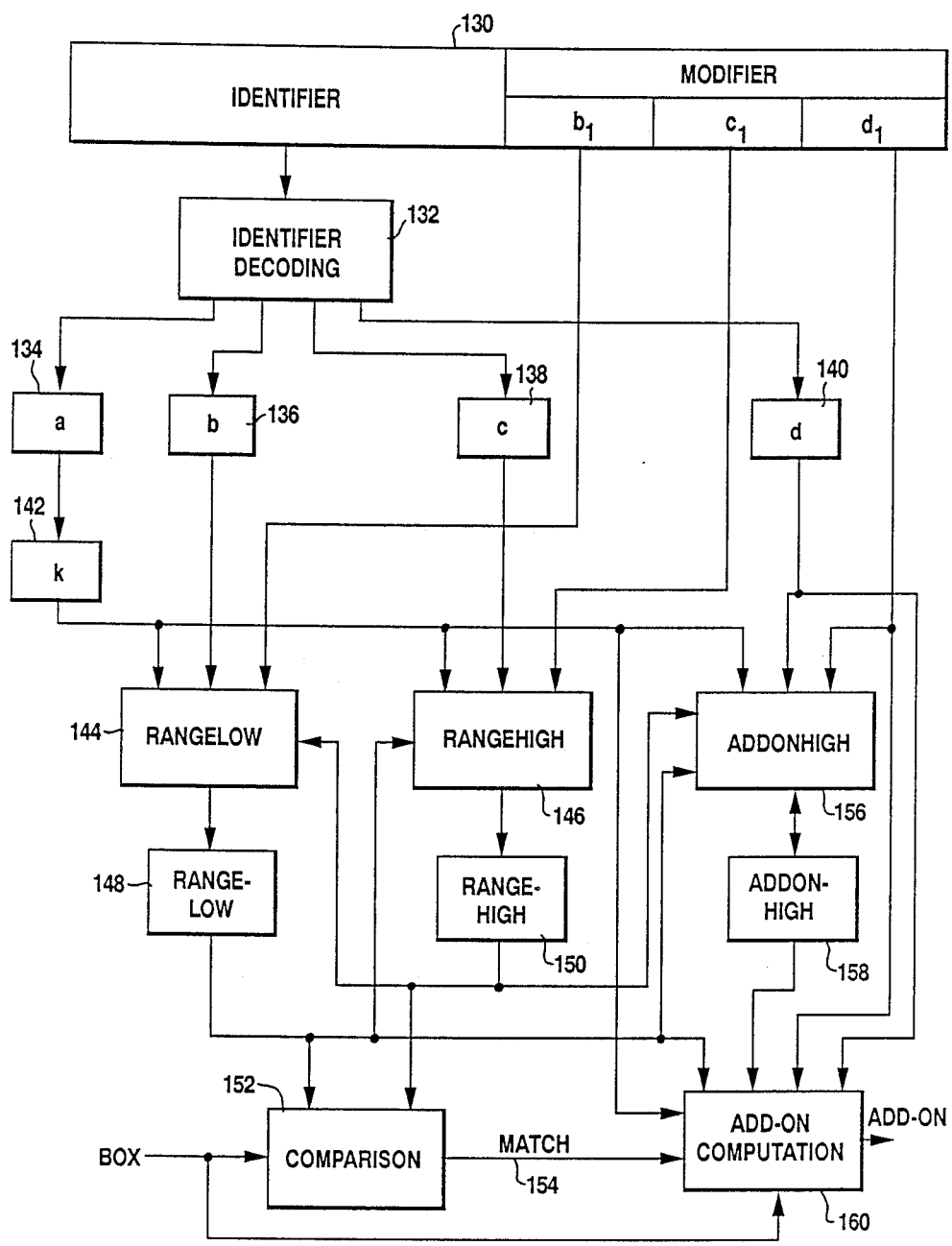
FIG. 12 is a block diagram illustrating a process for decoding P records.

FIG. 12 is a block diagram which illustrates the decoding of P records. Although the process is preferably performed by the microprocessor of the directory controller, it could be performed by hard-wired logic and the figure may be considered to be an appropriate logic configuration.

As shown in the figure, the identifier portion of each record 130 is first decoded utilizing the P Identifier Decoding Table 132 of FIG. 13, which will be described shortly, to obtain the attribute values a, b, c, and d at 134, 136, 138 and 140, respectively. The value of K is initialized at 142. The RANGELOW and RANGEHIGH values are computed at 144 and 146, respectively, using the rules specified by attribute values b and c, the value of K and modifier values $b_1$ and $c_1$ at 144 and 146, respectively, and the values are temporarily stored at 148 and 150, respectively. The read box number BOX is compared at 152 to these values, and a match is indicated at line 154. The high value of the add-on range ADDONHIGH is determined at 156 using the rule specified by attribute value d, the value of K, the value of ADDONHIGH from the previous P record, the values of RANGEHIGH and RANGELOW, and modifier value $d_1$. The value so obtained is temporarily stored at 158. Records are sequentially decoded in this manner. When the read box number matches the decoded range, as indicated on line 154, the add-on is computed at 160.

Since P records comprise variable length records which are concatenated, it is necessary to determine which bits of a string of bits of P Table data correspond to the identifier and modifier fields. This is accomplished by using the P Identifier Decoding Table 132 of FIG. 13, which is a program data structure that is stored in the directory controller. The first 12 bits of P Table data beginning with the first bit of a P record are used as an index into this table. The Huffman code identifier of each P record will point to one or more records in this table. Each record in the P Identifier Decoding Table gives the identifier length (bits 0–7), the attribute values (bits 8–23) and the lengths $Lb_1$, $Lc_1$, and $Ld_1$ of the modifier subfields (bits 40–63) for the corresponding P record. Bits 24–31 give the modifier field length as the sum of the modifier subfield lengths.

In order to index a particular record in the P Identifier Decoding Table, the value of the next 12 bits of P Table data starting at the first bit of the P record are multiplied by 8 to convert to a byte address, and this is added to the base address of the P Identifier Decoding Table to obtain the address of the first byte of the record of interest. The next 8 bytes (64 bits) beginning at this address comprise the P Identifier Decoding Table record. Although there are only 320 tuples, the length of the P Identifier Decoding Table is 4,096 records since the maximum length of an identifier may be 12 bits. Accordingly, the table contains many duplicated entries since, for example, if the identifier in the P record is only 3 bits, a total of 512 records in the table (corresponding to the 512 combinations of the identifier and the nine following bits of P Table data) must be identical in order to properly decode the P record.

The following outlines the steps of Process P2:

1. Transfer the first special character defined by Response P2 into the buffer.
2. Format the read post office box number as the 32-bit constant BOX:
  A. Preset BOX to zero.
  B. Store the sole or less significant alphabetic character, if present, in bits 0–4 of BOX.
  C. Store the more significant alphabetic character, if present, in bits 5–9 of BOX.
  D. Store the numeric portion, if present, as a 22-bit number in bits 10–31 of BOX.
3. Compute ADDRESS, the bit address of the next bit of P Table data to be decoded, and compute LASTBIT, the bit address of the last bit of data in the P file for the zone:
  A. Retrieve the P Table Pointer from the P Table Pointer Array at location $A_{ptpa}+3 \times$ ZIP index, add $A_{pt}$ (the base address of P Table), convert the sum to a bit address, and store as ADDRESS.
  B. Retrieve the P Table Pointer for the next zone from the P Table Pointer Array at location $A_{ptpa}+3$ (ZIP Index+1), add $A_{pt}$ (the base address of the P Table), convert the sum to a bit address, subtract 1, and store as LASTBIT.
4. Initialize variables: set the 32-bit variables RANGELOW, and RANGEHIGH, and the 16-bit variables ADDONHIGH, ADDON, and $D_1$ to zero; and set the 16-bit variable K to $1024_{10}$.
5. Perform P record decoding beginning at the location given by ADDRESS, and branch if the previous record was the final one:
  A. Decode the identifier into attribute values and determine lengths of the identifier, modifier, and subfields:
    (1). Beginning at ADDRESS, use the next 12 bits as an index into the P Identifier Decoding Table. Retrieve the record and store it in registers.
    (2). Add the identifier length (bits 0–7) to ADDRESS.
  B. Compute the bit address of the next P record and branch if the previous P record was the final one: compare the sum of ADDRESS and the modifier length (bits 24–31) to LASTBIT; if greater, go to step 8.
  C. Decode the modifier, if present, and set the variables:
    (1). If a (bits 8–11)=1, change K from 1 to 1024 or from 1024 to 1, and set RANGELOW and RANGEHIGH to zero.
    (2). Set RANGELOW from b (bits 12–15), $b_1$, K, and RANGEHIGH. Increase ADDRESS by $Lb_1$ (bits 40–47).
    (3). Set RANGEHIGH from c (bits 16–19), $c_1$, K, and RANGELOW. Increase ADDRESS by $Lc_1$ (bits 48–55).
    (4). Set ADDONHIGH from d (bits 20–23), $d_1$, K, RANGELOW, RANGEHIGH, and ADDONHIGH. Store $d_1$ (if present) as the 16-bit variable $D_1$. Increase ADDRESS by $Ld_1$ (bits 56–63).
6. Compare BOX with the decompressed range, and loop or branch if out of range:
  A. Compare RANGEHIGH to BOX. If smaller, go to step 5.
  B. Compare RANGELOW to BOX. If greater, go to step 8.
7. Compute, format, and transfer the add-on:
  A. Compute ADDON from K, BOX, RANGELOW, RANGEHIGH, ADDONHIGH, d, and $D_1$.
  B. Format ADDON as a 4-digit number if necessary.
  C. Transfer to buffer.
8. Transfer the second special character to the buffer.
9. Generate Response 2P by sending the buffer contents to the reader.

The execution time of Process P2 is estimated to be 10 milliseconds.

5. Process R2

Process R2 retrieves the add-on for a rural route or highway contract box address from the RRHC Table 44 records. This process consists of two subprocesses. In the first, the read box number, route type, and route number are formatted, and two R First Pointers are retrieved using the Zip Index. The R First Pointers thus retrieved are then used to retrieve route numbers and R Second Pointers from the R Second Pointer Table 42 of FIG. 8. The retrieved route numbers are compared to the read route number, and when a match is detected, and RRHC Table address is computed from the R Second Pointer corresponding to the matched retrieved route number and the second subprocess is initiated. In the second subprocess, RRHC Table records starting at the beginning address are retrieved and decompressed, and the decoded range in a record is compared to the read box number. If no match occurs, the address of the next record is computed and the record is decompressed. When a match occurs, the add-on is computed and transferred to the buffer.

Figures 13, 15:
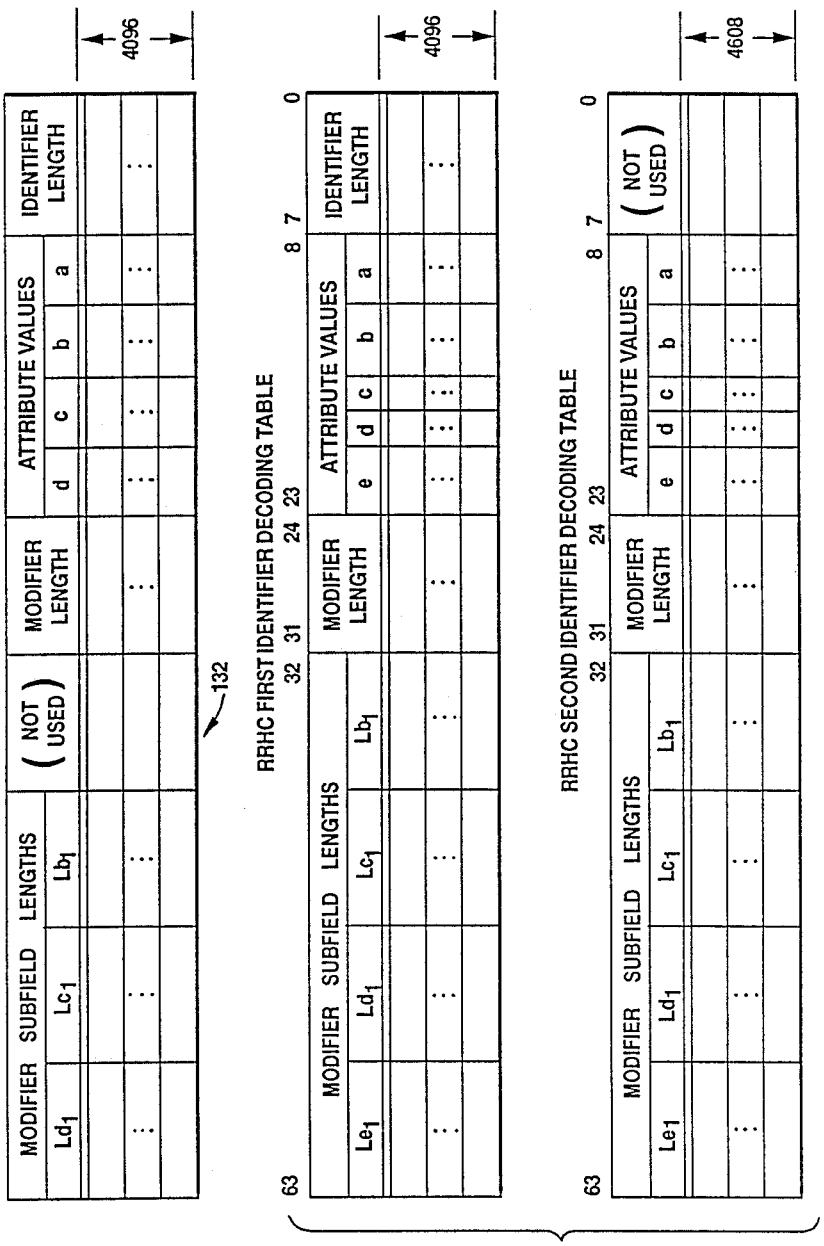
FIG. 13 illustrates a P Identifier Decoding Table program data structure for decoding P records.
FIG. 15 illustrates First and Second Identifier Decoding Tables comprising program data structures for decoding RRHC records.
Figure 14:
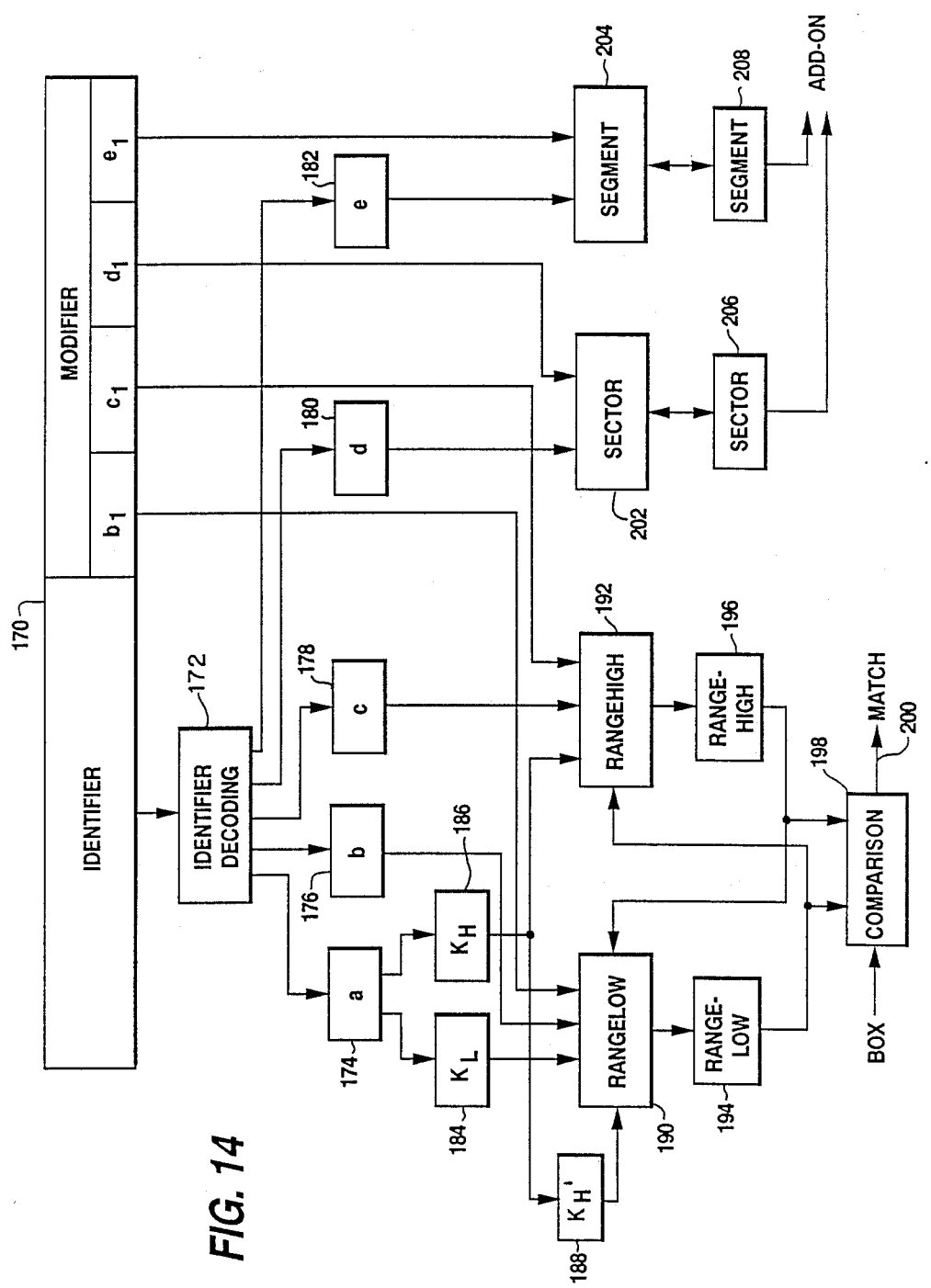
FIG. 14 is a block diagram illustrating a process for decoding RRHC records.

FIG. 14 is a block diagram illustrating the process for decoding RRHC records. As with Process P2, this process is preferably performed by the directory controller microprocessor, although it could be performed by hard-wired logic. As shown in the figure, the identifier portion of an RRHC record 170 is decoded at 172 using a program data structure, stored in memory 20 of the directory controller, comprising First and Second Identifier Decoding Tables, which are illustrated in more detail in FIG. 15 to produce the attribute values a–e at 174, 176, 178, 180 and 182. Variables $K_1$, $K_h$, and $K_h'$ may be initialized and stored in registers at 184, 186 and 188, respectively. RANGELOW and RANGEHIGH values are computed at 190 and 192, respectively, using a previous value for RANGEHIGH, RANGELOW, the rules specified by attribute values b and c, modifier values b1 and c1, and the values of $K_1$, $K_h$, and $K_h'$, as shown. The low and high range values may be stored at 194 and 196, respectively, and the read box number BOX may be compared with the range defined by these values at 198. A match is indicated at 200. The sector and segment values of the add-on are computed at 202 and 204, respectively, using the rules specified by attribute values d and e and modifier values $d_1$ and $e_1$, as shown. The computed sector and segment values may be stored in registers at 206 and 208, respectively, and output to form the add-on.

There are a total of 4,608 tuples. Each is given a unique 16-bit code according to the equation:

$$\text{16-bit code} = 111*(a + 9b + 36c + 144d + 576e)$$

where * stands for concatenation, a, b, c . . . are the tuple's attribute values, and the quantity in parentheses is expressed as a 13-bit number. In addition, the more common tuples are given, in accordance with their frequencies of use, Huffman codes which are no longer than 12 bits and do not start with 111.

As shown in FIG. 15, two program data structures, the First and Second Identifier Decoding Tables, are stored in the directory controller. The First Table, containing 4,096 8-byte records, is used for determining whether identifiers are Huffman codes or 16-bit codes and for decoding identifiers that are Huffman codes. The Second Table, containing 4,608 8-byte records, is subsequently used for decoding those identifiers determined by the use of the First Table as being 16-bit codes. Together, as in Process P2, these tables decode identifiers into attribute values, specify the lengths of the identifier and modifier fields, and give the lengths of each modifier subfield.

To access the tables of FIG. 15, the first 12 bits of RRHC Table data beginning with the start of an RRHC record are used as an address into the tables in the same manner as that described above for the P Identifier Decoding Table. The identifier length field of the First Identifier Decoding Table record thus located is examined; if the number it contains is 16, the first three bits of the RRHC record being decoded are stripped off and the next 13 bits are taken as an index into the Second Table. The records in the Second Identifier Decoding Table are similar to those in the first Identifier Decoding Table except that no identifier length field is used.

Upon decoding the first 12 bits of an RRHC record (or stripping off the first 3 bits and decoding the next 13) the address of the first byte of the record of interest in either the First or Second Identifier Decoding Tables is obtained. Beginning at that point, the next 8 bytes are taken to provide the attribute values and the lengths of the modifier subfields. The RRHC record is then decoded to determine the modifier values using the lengths specified by the records.

The following steps outline Process R2 performed by the directory controller:

1. Transfer the first special character defined in Response R2 into the buffer.
2. Format the read rural route or highway contract box number as a 32-bit constant BOX:
A. Preset BOX to zero.
B. Store the sole or most significant alphabetic character, if present, in bits 5-9 of BOX.
C. Store the less significant alphabetic character, if present, in bits 0-4 of BOX.
D. Store the numeric portion, if present, as a 22-bit number in bits 10-31 of BOX.
3. Format the read rural route or highway contract number as an 8-bit constant ROUTE:
A. Encode the most significant bit of ROUTE as a one for a rural route address or as a zero for a highway contract address.
B. Encode the route number as an integer in bits 0-6 of ROUTE.
4. Compute ADDRESS, the bit address of the next bit of RRHC table data to be decoded, and compute LASTBIT, the bit address of the last bit of data in the RRHC file for the route.
A. Retrieve the R First Pointer for the zone from the R First Pointer Array at location $A_{rfpa} + 2 \times \text{ZIP Index}$, and store as POINTER.
B. Retrieve the R First Pointer for the next zone from the R First Pointer Array at location $A_{rfpa} + 2 \times (\text{ZIP Index} + 1)$.
C. Compute the difference between the R First Pointers for the two zones and store as COUNT.
D. Match ROUTE with a route number from the R Second Pointer Table and calculate ADDRESS and LASTBIT:
  (1). Test COUNT; if zero, go to step 9.
  (2). Decrement COUNT.
  (3). Compare ROUTE with the route number from the R Second Pointer Table at location $A_{rspt} + 4 \times \text{POINTER}$:
    a. If not equal, increment POINTER and go to step 4.D.(1).
    b. If equal, retrieve the R Second Pointer, add $A_{rrhct}$ (the base address of the RRHC Table), convert the sum to a bit address, and store as ADDRESS. Then retrieve the R Second Pointer from the next R Second Pointer record at location $A_{rspt} + 4 \times (\text{POINTER} + 1) + 1$, add $A_{rrhct}$, convert the sum to a bit address, subtract 1, and store as LASTBIT.
5. Initialize variables: set RANGELOW, RANGEHIGH, and SEGMENT to zero, SECTOR to $96_{10}$, $K_1$ to $1024_{10}$, and $K_1$ to $1024_{10}$.
6. Perform RRHC record decoding beginning at the location given by ADDRESS, and branch if the previous record was the final one.
A. Decode the identifier into attribute values and determine lengths of the identifier, modifier, and subfields:
  (1). Beginning at ADDRESS, use the next 12 bits as an index into the RRHC First Identifier Decoding Table. Retrieve the record and store it in registers.
  (2). Test the identifier length (bits 0-7):
    a. If identifier length is not 16, add the identifier length to ADDRESS.
    b. If identifier length = 16, retrieve the record from the RRHC Second Identifier Decoding Table.
      1. Increase ADDRESS by 3.
      2. Beginning at ADDRESS, use the next 13 bits as an index into the RRHC Second Identifier Decoding Table. Retrieve the record and store it in registers over the record stored previously.
      3. Increase ADDRESS by 13.
B. Compute the bit address of the next RRHC record and branch if the previous RRHC record was the final one: compare the sum of ADDRESS and the modifier length (bits 24-31) to LASTBIT; if greater, go to step 8.
C. Decode the modifier, if present, and set the variables:
  (1). Load $K_h$ into $K_h'$, then set $K_l$ and $K_h$ from a (bits 8-11).
  (2). Set RANGELOW and update ADDRESS:
    a. Set RANGELOW from b (bits 12-15), $b_1$, $K_1$, and RANGEHIGH. Increase ADDRESS by $Lb_1$ (bits 32-39).
    b. Compare $K_l$ to $K_h'$. If greater, test $K_1$:
      1. If $K_l = 32$, set bits 0-4 of RANGELOW to zero.

2. If $K_l = 1024$, set bits 0–9 of RANGELOW to zero.
(3). Set RANGEHIGH from c (bits 16–17), $c_1$, $K_h$, and RANGELOW. Increase ADDRESS by $Lc_1$ (bits 40–47).
(4). Set SECTOR from d (bits 18–19), $d_1$, and SECTOR. Increase ADDRESS by $Ld_1$ (bits 48–55).
(5). Set SEGMENT from e (bits 20–23), $e_1$, and SEGMENT. Increase ADDRESS by $Le_1$ (bits 56–63).
7. Compare BOX with the decompressed range, and loop or branch if out of range:
A. Compare RANGEHIGH to BOX. If smaller, go to step 6.
B. Compare RANGELOW to BOX. If greater, go to step 8.
8. Format and transfer the add-on:
A. Format SECTOR as a two-byte number and transfer to buffer, more significant byte first.
B. Format SEGMENT as a two-byte number and transfer to buffer, more significant byte first.
9. Transfer the second special character into the buffer.
10. Generate Response 2R by sending the buffer contents to the reader.

The average execution time for Process R2 is estimated to be 15 milliseconds.

6. Process S2

The purpose of this process is to generate a formatted list containing all full street names within a zone corresponding to a given Zip Index as a preliminary to Process P3 (described hereinafter) which retrieves the add-on for a given street address. Process S2 comprises three subprocesses. The first transfers a special character, the Zip Index, and a delimiter character into the buffer. The next subprocess determines the location of the sections of the Street List 48 and the Byte-Count Array 50 for the zone (see FIG. 2), computes the number of streets in the zone, and transfers the Street List Pointer and Street Count to the last subprocess. The last subprocess generates the street list. First, it receives the Street List Pointer and Street Count, then decodes Street List records one at a time using First and Second Street List Decoding Tables, which are illustrated in FIG. 16 and which comprise program data structures stored in the directory controller. Using the codes in various fields of each record of these tables, the subprocess retrieves strings for directionals using a Directionals String File Index Table and Directionals String File shown in FIG. 17, and a string for suffixes using a Suffix String File illustrated in FIG. 18. The subprocess further assembles Lexicon strings into names using the Lexicon Index Table 34, and places the assembled names into the buffer with delimiter characters. When the number of decoded full street names equals the street count, the buffer is transferred to the reader.

Figure 18:
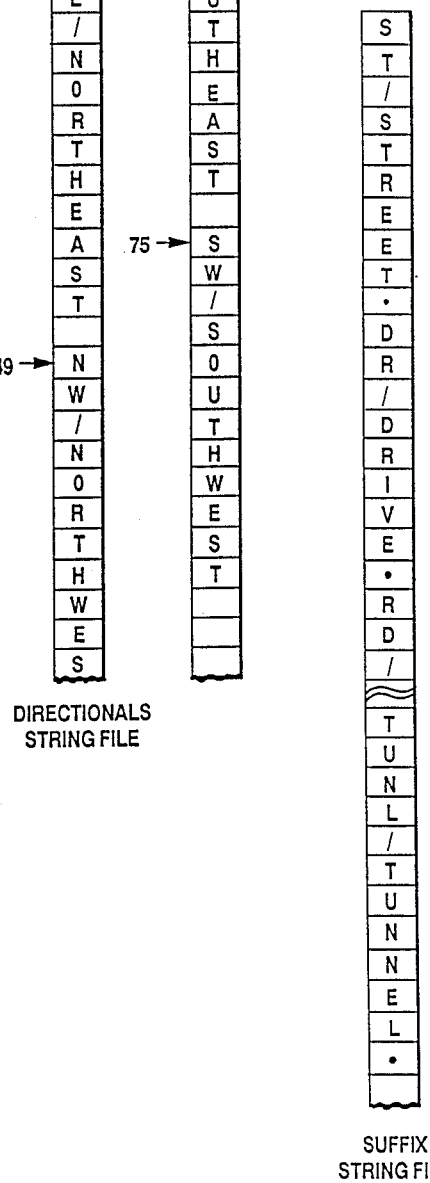
FIG. 18 illustrates a Suffix String File for decoding Street List records.

As shown in FIG. 16, the fields of the First Street List Decoding Table records comprise a field for a predirectional code Pre (bits 0–3), a postdirectional code Post (4–7), a field giving the suffix length (bits 8–11), a field giving the displacement into the Suffix String File of FIG. 18 (bits 12–23), a field labeled "Next Field" (bits 24–27) which is used to identify the next field to be decoded, and a "Delta" field (bits 28–31) which indicates the number of bits to the beginning of that field. "Next Field" points to either the beginning of an 11-bit Street Index, the beginning of a 19-bit Street Index, the beginning of a field for a length specifier, or the beginning of a code for a suffix. FIG. 16 indicates the interpretation of the Next Field and Pre and Post codes.

Figure 17:
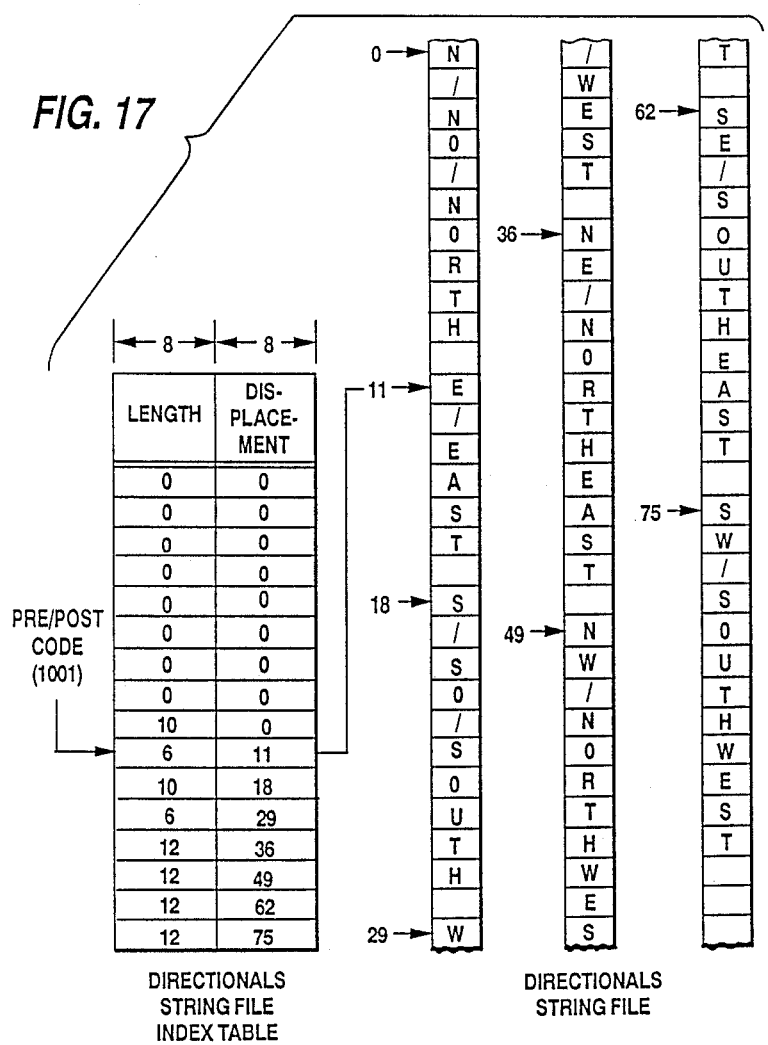
FIG. 17 illustrates a Directionals String File Index Table and Directionals String File for decoding Street List records.

The First Street List Decoding Table is indexed taking the first 12 bits of a Street List record. The codes stored in the Pre and Post fields are used, as indicated in FIG. 17, as indexes into the Directionals String File Index Table, which indicates a displacement into the Directionals String File and a file length. For example, the code 1001 (=9) for "East" (see FIG. 16) indexes the 9th location of the Directionals String File Index Table as indicated, which, in turn, indicates a displacement value of 11 from the beginning of the Directionals String File and a length of 6. This retrieves "E/East" from the Directionals String File. The suffix is retrieved from the Suffix String File of FIG. 18 using the suffix displacement and suffix length given in the record. The "Next Field" field of the record identifies the next field pointed to by "Delta".

The following outlines Process S2:
1. Transfer the first special character defined by Response S2 into the buffer, followed by the ZIP Index and an item-delimiter character.
2. Assemble the street name listing in the buffer:
A. Retrieve the Street List Pointer from the Street List Pointer Array at location $A_{slpa} + 3 \times \text{ZIP Index}$, add $A_{sl}$ (the base address of the street list), convert to a bit address, and store in a register as ADDRESS.
B. Compute the street count:
(1) Retrieve the Byte-Count Pointer from the Byte-Count Pointer Array at location $A_{bcpa} + 3 \times \text{ZIP Index}$ and store.
(2) Retrieve the Byte-Count Pointer for the next succeeding ZIP Index from the Byte-Count Pointer Array at location $A_{bcpa} + 3 \times \text{ZIP Index}$ and subtract from it the Byte-Count Pointer. Store the result in a register as the street count.
C. Test the street count; if $= 0$ (indicating that the zone contains no streets), store the special character in the buffer and go to step 3.
D. Decode the Street List record into the buffer, beginning at ADDRESS:
(1) Using the next 12 bits as an index into the First Street List Decoding Table, retrieve the record and store it in a register. Add DELTA (bits 28–31) to ADDRESS.
(2) Decode the predirectional:
a. Test PRE (bits 0–3). If not zero, load the string from the Directionals String File into the buffer using PRE as an index into the Directionals String File Index Table (See FIG. 17).
b. Store a component delimiter character in the buffer.
(3) Decode the identity of the next field, the Length Specifier, and the Index of Street Name. Test NEXT FIELD (bits 24–27):
a. If NEXT FIELD = 0, using the next 11 bits as an index into the Lexicon Index Table (at location $A_{lit} + 16 \times \text{Index of Street Name}$), place in the buffer the appropriate string(s) from the lexicon and alias-delimiter character(s), if necessary. Store a component-delimiter character in the buffer. Increase ADDRESS by 11.
b. If NEXT FIELD = 1, using the next 19 bits as an index into the Lexicon Index Table (at location $A_{lit} + 4 \times \text{Index of Street Name}$), place in the buffer the appropriate string(s) from the Lexicon and alias-delimiter character(s), if necessary.

Store a component-delimiter character in the buffer. Increase ADDRESS by 19.

c. If NEXT FIELD=2, test the bit that ADDRESS points to:
1. If=0, increment ADDRESS. Using the next 11 bits as an index into the Lexicon Index Table (at location $A_{lit}+16\times$ Index of Street Name), place in the buffer the appropriate string(s) from the Lexicon and alias-delimiter character(s), if necessary. Store a component-delimiter character in the buffer. Increase ADDRESS by 11.
2. If=1, increment ADDRESS. Using the next 19 bits as an index into the Lexicon Index Table (at location $A_{lit}+4\times$ Index of Street Name), place in buffer the appropriate string(s) from the Lexicon and alias-delimiter character(s), if necessary. Store a component-delimiter character in the buffer. Increase ADDRESS by 19.

d. If NEXT FIELD=3, using the next 11 bits as an index into the Second Street List Decoding table, retrieve the record, and store the most significant 3 bytes in the register. Add DELTA (bits 28-31) to ADDRESS. Test NEXT FIELD (bits 24-27):
1. If NEXT FIELD=0, using the next 11 bits as an index into the Lexicon Index Table (at location $A_{lit}+16\times$ Index of Street Name), place in the buffer the appropriate string(s) from the Lexicon and alias-delimiter character(s), if necessary. Store a component-delimiter character in the buffer. Increase ADDRESS by 11.
2. If NEXT FIELD=1, using the next 19 bits as an index into the Lexicon Index Table (at location $A_{lit}+4\times$ Index of Street Name), place in the buffer the appropriate strings(s) from the Lexicon and alias-delimiter character(s), if necessary. Store a component-delimiter character in the buffer. Increase ADDRESS by 19.

(4) Decode the suffix. Load the string from the Suffix String File (FIG. 18) into the buffer using the suffix length (bits 8-11) and suffix displacement (bits 12-23).

(5) Decode the postdirectional, if present:
a. Test POST (bits 4-7). If not zero, load the string from the Directionals String File into the buffer using POST as an index into the Directionals String File Index Table.
b. Store a component-delimiter character in the buffer, followed by an item-delimiter character.

E. Decrement the street count. Go to step 2.C.

3. Generate Response 2S by sending the buffer contents to the reader.

Process S2 is estimated to require for its execution approximately 90 microseconds per street or 12 milliseconds for an average zone.

7. Process 3

In Response S2, the reader receives the full names of all the streets within the zone corresponding to the Zip Index. It compares the full street name read from the mailpiece with the list to determine whether a match exists. If so, it generates Query 3, in response to which the directory controller executes Process 3 to retrieve the add-on for the read street address. As a first step, Process 3 inserts a special character into the buffer, formats the read street number to that shown in FIG. 24, formats the Street Index that identifies the full name in the street list that matched the read full street name and which was included in Query 3, and initializes variables. Using the Street Index and the Zip Index, as previously described, the process determines the address of the S Table street subsection corresponding to the street, computes the number of bytes of data in the subsection, thereby determining the subsection's ending address, and subsequently decodes S records starting at the beginning of the subsection. The six attribute values and the modifier values resulting from this decoding are decoded into software variables representing street range, parity, and add-on values. The process then determines whether the read street number is within the decoded street range and parity. If no match is determined, the process is repeated for the next S record. When a match is found, the process computes the add-on and transfers it into the buffer.

Figure 19:
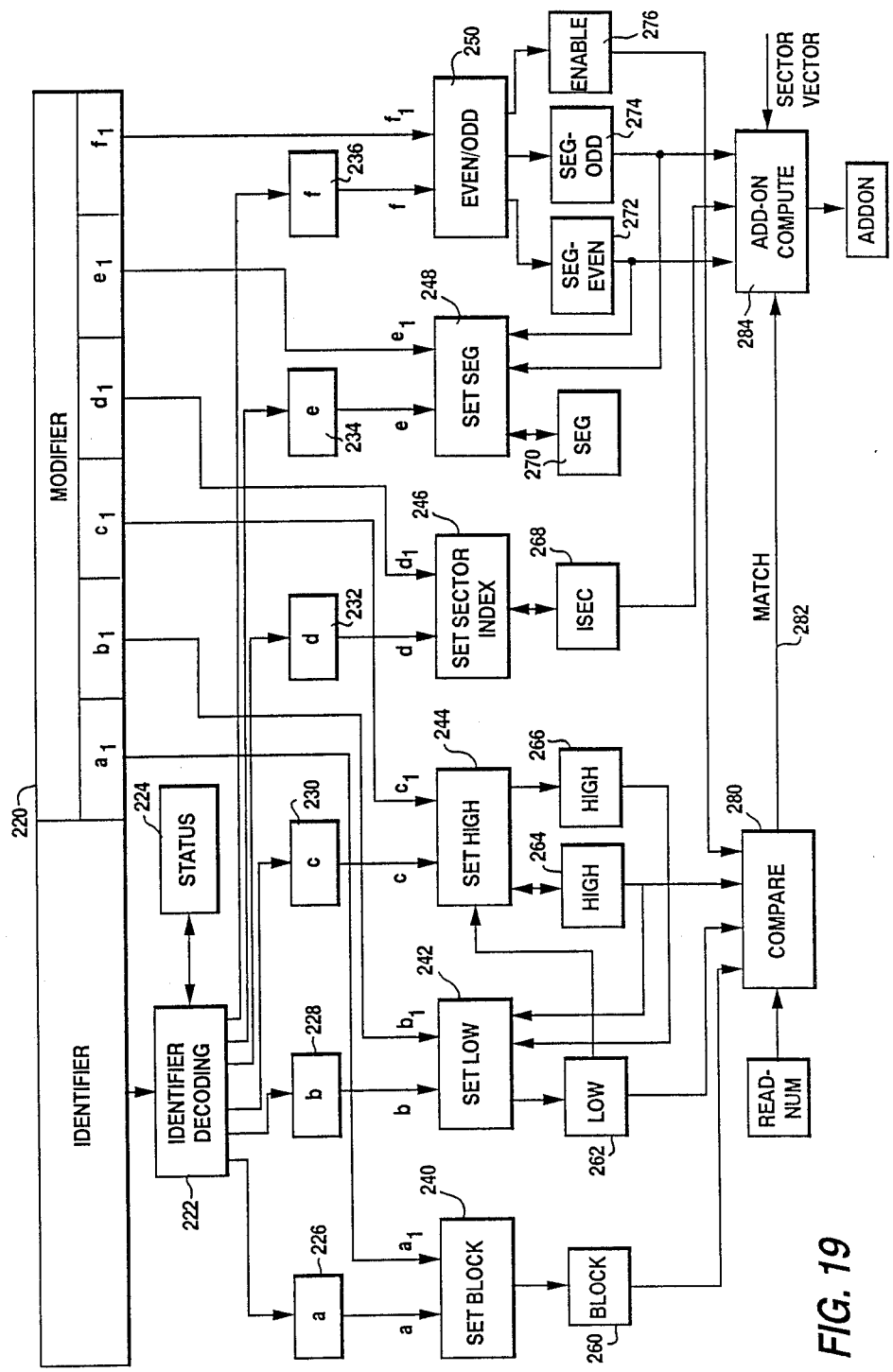
FIG. 19 is a block diagram illustrating a process of decoding S records.

FIG. 19 illustrates in block diagram form the process for decoding S records. The identifier portion of a S record 220 is decoded using program data structures comprising an S Identifier Decoding Table (shown in FIG. 20), an S Modifier Subfield Length Lookup Table shown in FIG. 21, and the value of STATUS derived from a STATUS Lookup Table shown in FIG. 22. This produces attribute values a-f, which may be stored at 226, 228, 230, 232, 234 and 236, respectively, in FIG. 19. These attribute values specify the rule which are used, in combination with corresponding modifier values $a_1-f_1$ from the decoded S record, to compute the values of BLOCK at 240, LOW at 242, HIGH at 244, the Sector Index at 246, the value SEG at 248 and the even-/odd segment values at 250. The results of these processes may be stored in registers 260–274, as shown in FIG. 19. The even/odd process 250 also produces an ENABLE variable which may be stored in a register 276. BLOCK, LOW, HIGH and ENABLE are used to derive the range values of the record, and a comparison is made with the read street number at 280. A match is indicated at 282 and the add-on is computed at 284 using the Sector Index, SEGEVEN, SEGODD, and the Sector Vector.

Figure 23:
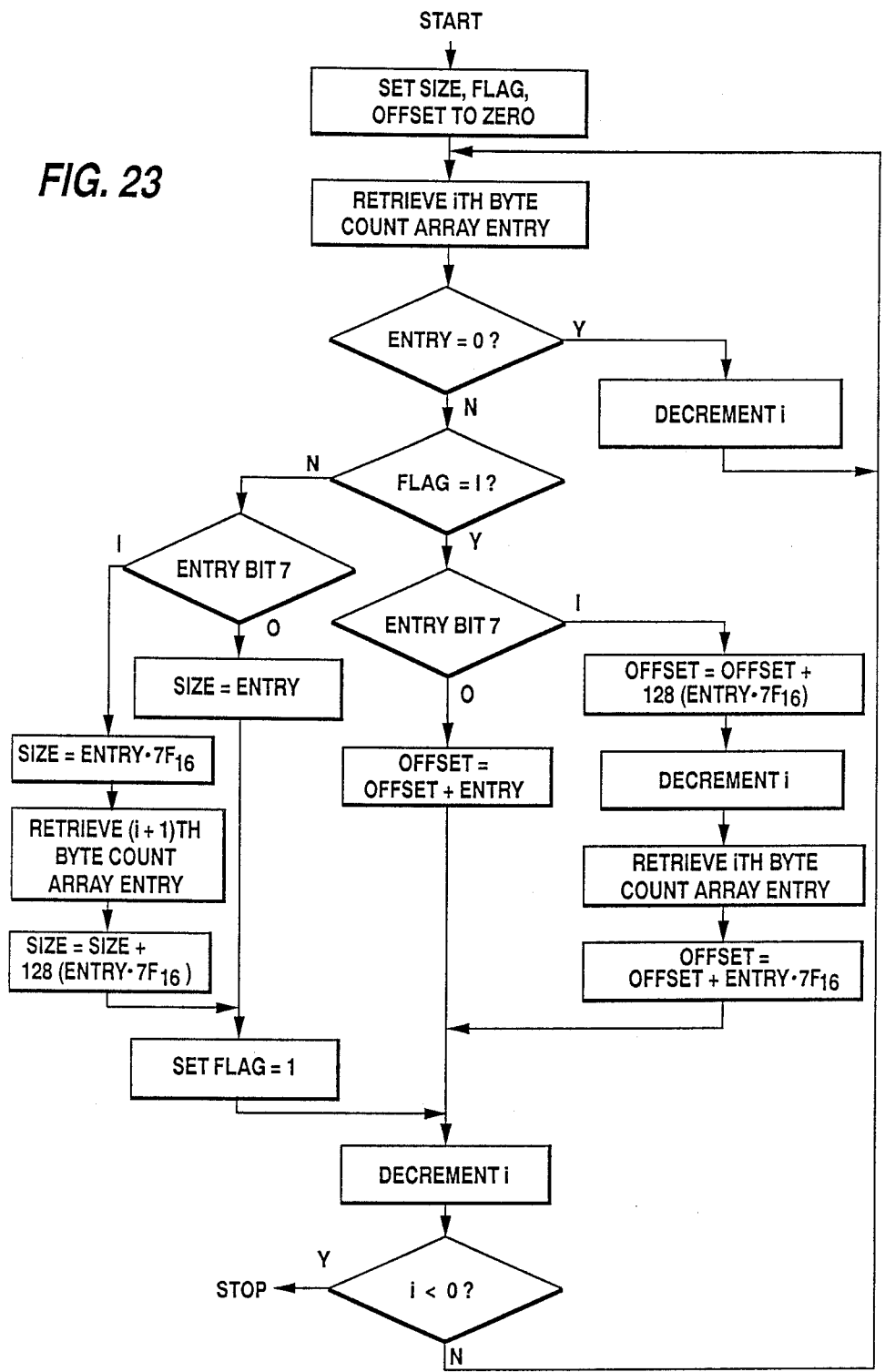
FIG. 23 is a flow chart illustrating a portion of Process 3 for computing street offset and size.

Prior to decoding S records, it is first necessary to determine the number of bytes of data in the S Table for the zone (SIZE) and the number of bytes from the beginning of the S Table to the first byte of the zone (OFFSET). FIG. 23 is a flow chart illustrating this process, and will be described in more detail in conjunction with step 4 of the outline of Process 3 presented below. This process was described in general terms in connection with the previous description of the S Table.

The S Identifier Decoding Table of FIG. 20 is used for decoding S records in a manner similar to that previously described in connection with the decoding of P records, and RRHC records. The S Identifier Decoding Table contains 8-byte records and is accessed by using the value of STATUS as the most significant 4 bits and the next 10 bits of the S Table data as the least significant part. There are 280,000 different 6-tuples possible. It would require 19 bits to cover all possible tuples and if this number of bits were used as an access into the S Identifer Decoding Table, it would be very large. Accordingly, every 6-tuple is assigned a 24-bit identifier comprising:

$$11111*(a+10b+40c+280d+2,800e+28,000f)$$

where the quantity in parentheses is expressed as a 19-bit number and the symbol * denotes concatenation, and a, b, c, d, e, and f are the attribute values of the tuple.

The more common 6-tuples are also assigned as many as nine Huffman codes each of lengths of no more than 10 bits. For the less common tuples, the identifier length indicated in the identifier length field (bits 0–5) of the corresponding S Identifier Decoding Table record will be 24, which indicates that it will be necessary to use the above equation for decoding. Instead of using a second table for decoding these tuples, as was done with rural records, the above equation will be used with the next 19 bits (following the five ones) of the S record to compute the attribute values. Once these values are known, the lengths of the modifiers can be determined from the S Modifier Subfield Length Lookup Table of FIG. 21, and the new value of STATUS can be determined using the STATUS Lookup Table of FIG. 22 knowing the previous value of STATUS and attribute values a, c, and f For Huffman codes, the S Identifier Decoding Table is used in a manner similar to that previously described for determining the attribute values and the modifier subfield lengths.

Figure 24:
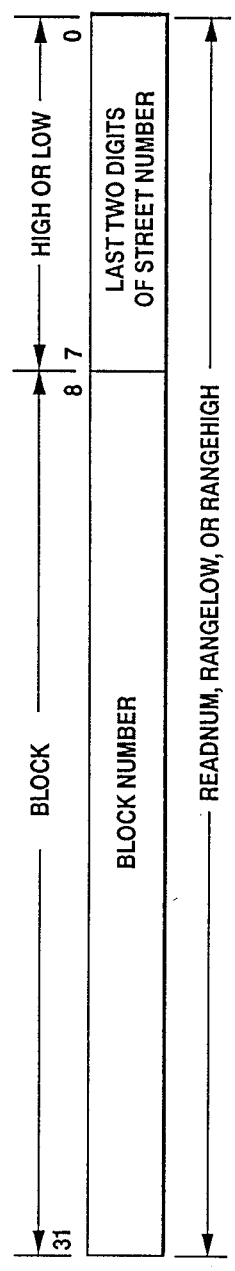
FIG. 24 illustrates a data format for variables used in Process 3.

Process 3 is detailed in the following outline:

1. Transfer the first special character defined in Response 3 into the buffer.
2. Format the read street number as a 32-bit variable READNUM, beginning at the less significant end as shown in FIG. 24:
A. Convert the 2-integer string corresponding to the last two digits of the street number to an 8-bit number 0–99 and store in bits 0–7.
B. Format the read block number as an integer and store in bits 8–31.
3. Format the Street Index as a 16-bit integer and store in a register.
4. Compute ADDRESS, the bit address of the next bit of S Table data to be decoded, and compute LASTBIT, the bit address of the last bit of S data for the street.
A. Compute SIZE (the number of bytes of data in the S Table for the zone), then compute the street offset, OFFSET (the number of bytes from the beginning of the S Table to the first byte for the zone) as shown in FIG. 23:
  (1). Store the Street Index as a 16-bit register variable
    I. Set a 8-bit register variable FLAG and 16-bit register variables SIZE and OFFSET to zero.
  (2). Retrieve the Byte-Count Pointer from the Byte-Count Pointer Array at location $A_{bcpa} + 3 \times ZIP$ Index.
  (3). Retrieve the byte-count entry from the Byte-Count Array at location $A_{bca} +$ Byte-Count Pointer $+ I$ and store as a 16-bit register variable ENTRY.
  (4). Test ENTRY. If $= 0$, decrement I and go to step 4.A.(3).
  (5). Test FLAG:
    a. If $= 0$, compute SIZE. First test bit 7 of ENTRY.
      1. If $= 0$, load ENTRY into SIZE.
      2. If $= 1$,
        (a). Set bit 7 to zero and load ENTRY into SIZE.
        (b). Retrieve the byte-count entry from the Byte-Count Array at location $A_{bca} +$ Byte-Count Pointer $+ I + 1$, and store as a 16-bit register variable ENTRY.
        (c). Set bit 7 of ENTRY to zero, shift left 7 bits, and add to SIZE.
    b. If $= 1$, compute OFFSET. First test bit 7 of ENTRY.
      1. If $= 0$, add ENTRY to OFFSET.
      2. If $= 1$,
        (a). Set bit 7 to zero, shift left 7 bits, and add to OFFSET.
        (b). Decrement I.
        (c). Retrieve the byte-count entry from the Byte-Count Array at location $A_{bca} +$ Byte-Count Pointer $+ I$ and store as a 16-bit register variable ENTRY.
        (d). Set bit 7 of ENTRY to zero and add ENTRY to OFFSET.
  (6). Decrement I.
  (7). Test I. If $\geq 0$, go to step 4.A.3.
B. Add to the street offset the S Table Pointer from the S Table Pointer Array at location $A_{stpa} + 4 \times ZIP$ Index.
C. Add to this sum $A_{st}$ (the base address of the S Table), convert the sum to a bit address by multiplying by 8, and store as ADDRESS.
D. Compute the address of the last bit of add-on data for the street. Multiply SIZE by 8 to convert to a bit address, add ADDRESS, subtract 1, and store as LASTBIT.
5. Initialize variables:
A. Set BLOCK, LOW, Isec, SEG, SEGEVEN, SEGODD, ENABLE and STATUS to zero.
B. Set HIGH and HIGH' to $99_{10}$.
6. Perform S record decoding beginning at the S Table location given by ADDRESS, and branch if the previous record was the final one.
A. Decode the identifier into attribute values and determine lengths of the identifier, modifier, and subfields:
  (1). Beginning at ADDRESS, form a 14-bit index into the S Identifier Decoding Table (FIG. 20) by using STATUS as the most significant 4 bits and the next 10 bits of S Table data as the least significant 10 bits. Retrieve the record and store in registers.
  (2). Test the identifier length (bits 0–7).
    a. If identifier length is not 24, add the identifier length to ADDRESS.
    b. If identifier length $= 24$, compute the attribute values, look up the subfield lengths and STATUS, compute the modifier length, and store them in the same registers:
      1. Increase ADDRESS by 5.
      2. Beginning at ADDRESS, compute the attribute values from the next 19 bits using the equation $X_{19} = a + 10b + 40c + 280d + 2,800e + 28,000f$, and store them in the same registers.
      3. Increase ADDRESS by 19.
      4. Retrieve the modifier subfield lengths from the S Modifier Subfield Length Lookup Table (FIG. 21). Compute the modifier length as their sum. Store all lengths in the register.
      5. Retrieve the new value for STATUS from the STATUS Lookup Table (FIG. 22) using STATUS and attribute values a, c, and f. Store in bits 6–9 of the register.
B. Compute the bit address of the next S record and branch if the previous S record was the final one:

compare the sum of ADDRESS and modifier length to LASTBIT; if greater, go to step 10.

C. Decode the modifier, if present, and set the variables as shown in FIG. 19:
  (1). Set BLOCK from a (bits 10-13), $a_1$, and BLOCK (240). Increase ADDRESS by $La_1$ (bits 40-43).
  (2). Set LOW from b (bits 14-15), $b_1$, HIGH, and HIGH'(242). Increase ADDRESS by $Lb_1$ (bits 44-47).
  (3). Set HIGH from c (bits 16-19), $c_1$, and LOW, and store old value of HIGH in HIGH if HIGH changes (244). Increase ADDRESS by $Lc_1$ (bits 48-51).
  (4). Set $I_{sec}$ from d (bits 20-23), $d_1$, and $I_{sec}$ (246). Increase ADDRESS by $Ld_1$ (bits 52-55).
  (5.) Set SEG from e (bits 24-27), $e_1$, SEG, SEGEVEN, and SEGODD (248). Increase ADDRESS by $Le_1$ (bits 56-59).
  (6). Set ENABLE (276) from f (bits 28-31). Test f; if not 1, store SEG in SEGEVEN (272). Set SEGODD (274) from f, $f_1$, and SEG. Increase ADDRESS by $Lf_1$ (bits 60-63).

7. Compare the read street number with the decompressed range and parity (280), and loop or branch if out of range or parity:
A. Compare RANGEHIGH to READNUM. If smaller, go to step 6.
B. Test the parity bit in ENABLE corresponding to the parity of READNUM. If =0, go to step 6.
C. Compare RANGELOW TO READNUM. If greater, go to step 10.

8. Compute, format, and transfer the add-on (284):
A. Compute the sector value:
  (1). Beginning at location $A_{sva}+13\times$ZIP Index (the beginning of the Sector Vector), scan and count bits and ones until the ones count equals $I_{sec}$.
  (2). Format the bit count as two BCD bytes and transfer to buffer, more significant byte first.
B. Compute the segment value: format SEGEVEN or SEGODD (depending on parity of READNUM) as two BCD bytes and transfer to buffer, more significant byte first.

9. Go to step 6.

10. Transfer the second special character into the buffer.

11. Generate Response 3 by sending the buffer contents to the reader

The execution time for Process 3 is estimated to be 10 microseconds per byte-count plus 250 microseconds per S record, or an average of 2 milliseconds.

While a preferred embodiment of the invention has been shown and described, it will be appreciated by those skilled in the art that changes may be made in this embodiment without departing from the principles and spirit of the invention, the scope of which is defined in the appended claims.

GLOSSARY $A_{bca}$—The base address of the Byte-Count Array.
$A_{bcpa}$—The base address of the Byte-Count Pointer Array.
$A_{cnia}$—The base address of the City-Name Index Array.
Add-on—The last four digits of a ZIP+4 Code; the sector number followed by the segment number.
ADDON—A retrieval and decompression software variable.
ADDONHIGH—A retrieval and decompression software variable.
$A_{lex}$—The base address of the Lexicon.
Alias—A name commonly used as a substitute for another and having a similarity; for example, 2nd is an alias for Second.
Alias Count—A 3-bit field expressing the number of succeeding Lexicon Index Table records that are aliases to the parent record.
$A_{lit}$—The base address of the Lexicon Index Table.
Alternate—A name commonly used as a substitute for another and having no similarity, for example, Broadway and Route 1.
$A_{pt}$—The base address of the P Table.
$A_{ptpa}$—The base address of the P Table Pointer Array.
$A_{rfpa}$—The base address of the R First Pointer Array.
$A_{rrhct}$—The base address of the RRHC Table.
$A_{rspt}$—The base address of the R Second Pointer Table.
$A_{sia}$—The base address of the State Index Array.
$A_{sl}$—The base address of the Street List.
$A_{slpa}$—The base address of the Street List Pointer Array.
$A_{st}$—The base address of the S Table.
$A_{stpa}$—The base address of the S Table Pointer Array.
$A_{sva}$—The base address of the Sector Vector Array.
$A_{zisa}$—The base address of the ZIP Index Sparse Array.
BOX—A retrieval and decompression software variable.
Byte-Count Entry—A 1- or 2-byte quantity indicating the size of an S Table street subsection.
Byte-Count Pointer—A 24-bit number expressing the location of the byte-count entry for the first street of a zone relative to the beginning of the Byte-Count Array.
Character Count—A 5-bit field expressing the number of successive Lexicon characters comprising the string defined in the Lexicon Index Table record.
City-Name Index—A 16-bit number that identifies a city name and its aliases.
Code for Directionals—A 1-, 4-, 6-, or 10-bit sequence indicating one of eighty-one combinations of predirectional and postdirectional.
Code for Suffix—A 2- to 10-bit sequence indicating one of 144 street suffixes.
Coding—The substitution of compressed data symbols for source data symbols.
Error Code—A sequence of characters indicating retrieval failure.
Explicit—Stored as a modifier subfield.
4-Tuple—An ordered set of four attribute values {a,b,c,d}.
5-Tuple—An ordered set of five attribute values {a,b,c,d,e}.
6-Tuple—An ordered set of six attribute values {a,b,c,d,e,f}.
General Delivery Record—A record in the ZIP+4 National Directory file with a record type of twenty-six that provides add-on information for general delivery addresses.
HIGH—A retrieval and decompression software variable.
HIGH'—A retrieval and decompression software variable.
Highway Contract Record—A record in the ZIP+4 National Directory file with a record type of eighteen that provides add-on information for mail addressed to a highway contract route.
Identifier—A sequence of bits that specifies a tuple.
Index of Street Name—An 11- or 19-bit number that identifies a street name and its aliases.

I*sec*—The Sector Index; a retrieval and decompression software variable.

K—A retrieval and decompression software variable.

$K_h$—A retrieval and decompression software variable.

$K_h'$—A retrieval and decompression software variable.

$K_1$—A retrieval and decompression software variable.

Length Specifier—A 1-bit field specifying the length of the Index of Street Name.

Lexicon—A one-dimensional array containing strings of characters that form names.

Lexicon Displacement—A 21-bit field expressing the location of the first character of a string relative to the beginning of the lexicon.

LOW—A retrieval and decompression software variable.

Memory Address Component—Any constituent part of a memory address, including base addresses, offsets, counts, displacements, pointers, and indices.

Modifier—A variable-length concatenation of bit subfields.

P Record—An entry in the P Table of the compressed directory.

P Table Pointer—A 24-bit quantity expressing the number of bytes between the beginning of the P Table and the beginning of the P file for the particular zone.

Postal Address Element—Any part of a destination address.

Post Office Box Record—A record in the ZIP+4 National Directory file with a record type of fourteen that provides add-on information for a post office box or a defined range of post office boxes.

Postdirectional—A postal address element following the street suffix and having one of nine values: N, E, S, W, NE, NW, SE, SW, and blank.

Postmaster Record—A record in the ZIP+4 National Directory file with a record type of twenty-two that provides add-on information for mail addressed to a postmaster.

Predirectional—A postal address element preceding the street name and having one of nine values: N, E, S, W, NE, NW, SE, SW, or blank.

Prefix Code—A code having the property of instantaneous decodability; that is, no code word is the prefix of any other code word in the ensemble.

R First Pointer—A 16-bit quantity expressing one-fourth the number of bytes between the beginning of the R Second Pointer Table and the First R Second Pointer record for the particular zone.

R Second Pointer—A 24-bit quantity expressing the number of bytes between the beginning of the RRHC Table and the beginning of the RRHC file for the particular zone.

RANGEHIGH—A retrieval and decompression software variable.

RANGELOW—A retrieval and decompression software variable.

RRHC Record—An entry in the RRHC Table of the compressed directory.

Rural Route Record—A record in the ZIP+4 National Directory file with a record type of eighteen that provides add-on information for mail addressed to a rural route.

S Record—An entry in the S Table of the compressed directory.

S Table Pointer—A 32-bit quantity expressing the number of bytes between the beginning of the S Table and the beginning of the section of the S Table for the particular zone.

SEC—A retrieval and decompression software variable.

Sector—The first two digits of an add-on; a retrieval and decompression software variable.

Sector Index—A number from zero to ninety-nine that identifies a sector number through one level of indirection.

Sector Vector—A 13-byte sequence, the least significant 100 bits of which correspond to the 100 sectors, indicating the presence of add-on assignments in each sector. A one indicates at least one add-on is assigned in the sector; that is, the sector is assigned. The most significant 4 bits in this sequence contain the add-on's for general delivery and postmaster addresses.

SEG—A retrieval and decompression software variable.

SEGEVEN—A retrieval and decompression software variable.

SEGODD—A retrieval and decompression software variable.

Segment—The last two digits of an add-on; a retrieval and decompression software variable.

State Index—A unique 8-bit number that identifies a state.

STATUS—A retrieval and decompression software variable.

Street Block Number—The hundreds digits of a street address indicating a block number.

Street Index—A 16-bit number generated by the reader identifying a specific full street name.

Street List Pointer—A 24-bit quantity expressing the number of bytes between the beginning of the Street List and the beginning of the street file for the particular zone.

Street Range—A continuum of street numbers defined by the lower (LOW) and upper (HIGH) bounds.

Street Record—A record in the ZIP+4 National Directory file with a record type of ten that provides add-on information for street addresses.

Suffix—A postal address element appearing just after the street name in a street address.

Table Index—A 13-bit field that locates a target Lexicon Index Table record.

Tuple—An ordered set of four, five, or six attribute values.

XN—A format specifying a numerical postal address element.

XN1A—A format specifying a postal address element with one trailing alphabetical character.

XN2A—A format specifying a postal address element having two trailing alphabetical characters.

ZIP—Zone Improvement Plan.

ZIP Index—A unique, sequentially assigned 16-bit number from 1 to approximately 42,000 that identifies each assigned ZIP Code.

I claim:

1. A method of storing and retrieving data comprising the steps of determining from a multiplicity of source data records a group of attributes which represent selected types of characteristics of the source data records and selected types of relationships between elements of source data records, each attribute having an associated predetermined set of rules which define different specific characteristics or relationships of the types represented by that attribute, and each rule of the set being designated by a corresponding attribute value; assigning to each source data record a set of attribute values, one attribute value for each of said attributes, each attribute value designating a particular one of the rules of the associated set of rules which specified a particular characteristic or relationship of the source record; assigning to the source data record another set of modifier values for use with the rules designated by the attribute values assigned to such source data record, the modifier values comprising explicit data values which together with such rules express information contained in the source data record; forming a compressed data record from the attribute values and the modifier values; and storing in a data storage the compressed data record in place of said source data record.

2. The method of claim 1 further comprising, as an initial step, sorting source data records in a predetermined sequence.

3. The method of claim 2, wherein each source data record includes an element which represents a data value, and wherein said sorting comprises sorting source data records in order of data value.

4. The method of claim 3, wherein said data value is a numeric value, and said predetermined sequence comprises increasing numeric order.

5. The method of claim 3, wherein said data value is an alphabetic value, and said sorting comprises sorting source data records alphabetically.

6. The method of claim 2, wherein said determining comprises analyzing sorted source data records to determine common characteristics and relationships, and selecting rules for each predetermined set of rules associated with an attribute which define the common characteristics or relationships represented by such attribute.

7. The method of claim 6, wherein each source data record sets forth a range represented by first and second range values, and wherein said attributes comprise a first attribute having a first associated set of rules which define a first one of said range values in terms of a range value of a previous source data record, and a second attribute having a second associated set of rules which define the second range value in terms of the first range value.

8. The method of claim 7, wherein said first set of rules associated with said first attribute further includes a rule which specifies the first range value explicitly as a modifier value.

9. The method of claim 1, wherein said characteristics comprise source data record formats, and said group of attributes comprise an attribute having an associated set of rules which define different formats.

10. The method of claim 1, wherein said compressed data record comprises an identifier field concatenated with a modifier field, and wherein said forming comprises inserting in the identifier field a code which represents the set of attribute values for said source data record.

11. The method of claim 10, wherein said code comprises a Huffman variable length code.

12. The method of claim 10, wherein there is a multiplicity of compressed data records corresponding to a multiplicity of source data records, each compressed data being a variable length record, and wherein said storing comprises concatenating said multiplicity of compressed data records and storing the concatenated records.

13. The method of claim 10 comprising retrieving the compressed data record and decompressing the retrieved compressed data record by processing the record in accordance with the rules designated by the attribute values of the record and employing the modifier values in said processing.

14. The method of claim 13, wherein said processing comprises employing a program data structure to decode the compressed data record, the program data structure specifying the lengths of the identifier and modifier fields of the record, and converting the code in the identifier field to said set of attribute values.

15. The method of claim 14, wherein said retrieving comprises decoding compressed records sequentially, comparing a range of values contained in each compressed data record with a desired value, and, upon a match being detected, outputting the information contained in the corresponding compressed data record.

16. A method of compressing source data which includes a multiplicity of source data records, comprising the steps of sorting the source data records into sequential order; constructing corresponding compressed data records by forming each compressed data record as a combination of a tuple of attribute values which represent selected characteristics of said compressed data record and designates a computational relationship between successive source data records and a set of modifier data values which together with the characteristics and the computational relationship specify information contained in a source data record in terms of the information content of a previous source data record; and storing said compressed data records in place of the source data records.

17. The method of claim 16, wherein said relationship is one which can be defined in terms of a rule for computing the information content of the source data record from the information content of the previous source data record, and wherein said code designates one of a predetermined set of such rules.

18. The method of claim 17 further comprising the steps of, prior to said constructing, analyzing the source data records to determine common attributes comprising types of characteristics and types of relationships between source data records and between elements of source data records, defining for each of said characteristics and relationships a corresponding set of rules, each rule of which set specifies a particular characteristic or relationship, designating each rule of each set by a corresponding attribute value, assigning to each source data record a set of attribute values which specify the particular characteristics and relationships applicable to said source data record, and assigning to said set of values a unique code.

19. The method of claim 18, wherein said unique code comprises a variable length Huffman code, and wherein said assigning comprises assigning Huffman codes having the shortest lengths to the most common sets of attribute values.

20. The method of claim 19, wherein said constructing comprises concatenating an identifier field containing said code with a modifier field containing said set of modifier values to form a variable length compressed data record, and said storing comprises concatenating said compressed data records.

21. The method of claim 19 further comprising storing a program data structure which identifies the lengths of the identifier and modifier fields of each compressed data record.

22. The method of claim 21 further comprising sequentially decoding compressed data records by processing each compressed data record in accordance with the rules specified in the identifier field of the compressed data record and the modifier values contained in the modifier field of the compressed data record, and reconstructing the corresponding source data record.

23. A method of storing ZIP+4 postal source data in compressed form and of retrieving a ZIP+4 add-on for a given postal address, there being a plurality of different types of postal addresses and each type of postal address having associated therewith a plurality of source data records, the method comprising the steps of, for each different type of postal address, ordering corresponding source data records into a hierachical organization which is inherent in the source data; compressing the ordered source data records to produce corresponding compressed data records, the compressed data records including records which contain a postal address range and add-ons for postal addresses in that range, said compressing comprising defining sets of rules which prescribe ways of computing range values which specify said postal address range and add-ons for postal addresses in such range in terms of other range values and add-ons for other postal address ranges, assigning to each compressed data record a tuple of attribute values which specify particular rules of said sets of rules and modifier values for use with the rules specified by the attribute values for reproducing information contained in the corresponding source data record; storing the compressed data record in a corresponding table in a memory, there being a plurality of files in each table, one for each zip code, and a plurality of tables in said memory, at least one table for each type of postal address; converting a zip code for the given postal address into a memory address which accesses the file for that zip code in the table for the given postal address type; sequentially decoding compressed data records in the accessed file; comparing the given postal address with the address range in each decoded compressed data record; and, upon a match being obtained, computing from the compressed data record the add-on for the given postal address.

24. The method of claim 23, wherein said ordering comprises ordering source data records numerically and alphabetically.

25. The method of claim 23, wherein said converting comprises storing in the memory a first data array containing a Zip Index for each assigned zip code and a plurality of second data arrays containing memory address components pointing to memory locations in the tables at which files corresponding to the Zip Indexes are stored; accessing the first data array using the zip code to obtain the Zip Index; and accessing one of said second data arrays using the Zip Index to obtain a pointer to the memory address of said corresponding file.

26. The method of claim 23, wherein said decoding comprises sequentially decoding compressed data records starting a the beginning of the accessed file.

27. The method of claim 26, wherein said decoding comprises decoding the address range in each compressed data record into a low range value and a high range value, and said comparing comprises comparing a number of the given postal address with the high range value until the high range value exceeds the number, and then comparing the number with the low range value, a match being obtained when the low range value is less than the number and the high range value is greater than the number.

28. The method of claim 23, wherein said different types of postal addresses include post office box addresses, rural route addresses, and street addresses.

29. The method of claim 23, further comprising storing in said memory character strings in a Lexicon, and assembling said character strings into a state name, a city name, and a plurality of street names for said zip code.

30. The method of claim 29, wherein said assembling comprises storing in said memory a Lexicon Index Table containing records which specify Lexicon addresses of character strings and the manner of combining character strings to form said names.

31. The method of claim 23, wherein said different types of postal addresses include postmaster addresses and general delivery addresses, and wherein said method further comprises storing in said memory an array containing records which specify the add-on's for postmaster and general delivery addresses for zip codes which have such types of addresses.

32. The method of claim 23 wherein said compressing comprises forming each compressed data record as a variable length record having an identifier field concatenated with a modifier field, and assigning to the identifier field a code representative of the tuple of attribute values for said compressed data record, and assigning the modifier values to the modifier field.

33. The method of claim 32, wherein said decoding comprises employing a program data structure which specifies the lengths of the identifier and modifier fields of the compressed data record, converting the code in the identifer field to the tuple of attribute values, and reconstructing the source data record using the modifier values in the modifier field of the compressed data record and the rules specified by the attribute values.

34. The method of claim 33 further comprising storing different program data structures for each of the different types of postal addresses.

35. A system for storing and retrieving data comprising a memory for storing compressed data records corresponding to source data records, each compressed data record comprising an identifier and a modifier which are concatenated, the identifier comprising a code representing a tuple of attribute values, each attribute value designating a particular one of a predetermined set of rules which specify relationships between elements of a corresponding source data record and between the source data record and another source data record, the modifier comprising a set of modifier values for use with the rules designated by the attribute values for reproducing information contained in the corresponding source data record; and controller means for retrieving a compressed data record from the memory, the controller means including means for processing the compressed data record in accordance with the rules designated by the attribute values and the modifier values to reproduce the information content of the corresponding source data record.

36. The system of claim 35, wherein the controller means comprises a microprocessor having means for decoding the identifier of the compressed data record to produce said tuple of attribute values, another memory for storing programs embodying processes prescribed by each of the rules of said predetermined set of rules; and means responsive to the programs specified by the attribute values for processing the compressed data record to reproduce the source data record.

37. The system of claim 36, wherein said code and said modifier values have variable lengths, and wherein said decoding means comprises program data structures stored in said other memory which specify the lengths of the identifier and modifier of each compressed data record.

38. The system of claim 37, wherein said retrieving means comprises means for converting an element of source data into an index, and means for converting said index into a memory address for accessing a file of compressed data records corresponding to the element of source data.

39. The system of claim 38, wherein said converting means comprises a data array stored in the first-mentioned memory, the data array containing pointers to memory locations at which different files of compressed data records are stored.

40. The system of claim 36, wherein said memory comprises a plurality of tables for storing compressed data records corresponding to different types of source data records, the compressed data records in each table being arranged in files in accordance with a predetermined sequence of corresponding source data records, and wherein said decoding means comprises means for decoding compressed data records sequentially from the beginning of a file.

41. The system of claim 40, wherein the different types of source data records are characterized by different predetermined sets of rules which specify relationships between elements of such source data records and between source data records of that type, and wherein said other memory stores programs embodying processes prescribed by each of the rules of said predetermined sets of rules and program data structures specific to the compressed data records stored in the different tables.

42. The system of claim 35, wherein said first mentioned memory comprises a semiconductor RAM.

43. A system for storing ZIP+4 postal information and for retrieving a ZIP+4 add-on for a given postal address comprising memory means for storing compressed ZIP+4 postal source data, and a controller for retrieving and decompressing the compressed source data, the memory means comprising a plurality of tables for storing compressed data records for different types of postal addresses; a first array for converting a zip code representative of a postal zone into a corresponding Zip Index; a plurality of second arrays, each accessed by the Zip Index, for storing address pointers to locations of files in the tables corresponding to the Zip Index, each file comprising a plurality of concatenated compressed data records, each compressed data record comprising an identifier field and a modifier field, the identifier field containing a code representative of a tuple of attribute values which designate a predetermined set of rules which specify relationships between elements of a corresponding source data record and between the corresponding source data record and another source data record, and the modifier field comprising a set of modifier values for use by the rules specified by the attribute values for reproducing information contained in the corresponding source data record.

44. The system of claim 43, wherein the compressed data records in each file are stored in accordance with a predetermined sequence of corresponding source data records.

45. The system of claim 44, wherein said predetermined sequence comprises increasing numerical and alphabetical order.

46. The system of claim 45, wherein said other source data record is a previous source data record.

47. The system of claim 43, wherein the compressed data records include a first portion which represents a range of postal addresses and a second portion which represents add-on's for addresses in that range, and wherein the rules designated by the attribute values include first rules which together with first ones of the modifier values specify said range of postal addresses and second rules which together with second ones of the modifier values specify the add-on's for postal addresses in the range.

48. The system of claim 47, wherein the first and second rules specify the range and the add-on, respectively, in terms of a range value and an add-on value in a previous record.

49. The system of claim 48, wherein said first rules include a rule for computing a low value of said range of postal addresses from a high value of a postal address range in said previous record, and another rule for computing a high value of the range of postal addresses from the low value, and wherein the second rules include a rule for computing the add-on value from an add-on value from said previous record.

50. The system of claim 48, wherein said predetermined set of rules designated by the attribute values include a third rule which specifies a format of the range of postal addresses.

51. The system of claim 43, wherein said different types of postal addresses include post office box addresses, rural route addresses, and street addresses, and said tables comprise a P Table for storing compressed data records corresponding to post office box addresses, R Tables for storing compressed data records corresponding to rural route addresses, and a S Table for storing compressed data records corresponding to street addresses, and wherein the rules designated by the attribute values of compressed data records in each of such table specified different relationships.

52. The system of claim 51, wherein said compressed data records are variable length records, and the controller comprises a microprocessor having program data structures which indicate field lengths of the identifier and modifier fields of each compressed data record, and means for processing the compressed data records in accordance with said rules and modifier values to decompress the records and reconstruct the information contained therein.

53. The system of claim 52, wherein the memory means further comprises a Lexicon for storing character strings and a Lexicon Index Table for addressing the Lexicon to access character strings and to assemble the character strings into names and parts of names, and wherein said plurality of second arrays includes a State Index Array for producing a State Index for accessing the Lexicon to produce a state name corresponding to the Zip Index, a City Name Index Array for producing City Name Indexes for accessing the Lexicon to produce city names corresponding to the Zip Index, a Street List Pointer Array for producing a Street List Pointer, and means responsive to the Street List Pointer for accessing the Lexicon to produce the names of streets located in the postal zone corresponding to the Zip Index.

54. The system of claim 53, wherein said means responsive to the Street List Pointer comprises a Street List Table storing records having a first field containing a code for a street name, a second field containing a code for a suffix, and a third field containing a code for directionals, the code for a street name being used to access the Lexicon to produce a primary name of a street, and the codes for the suffix and the directionals being used to access other tables stored in the memory means which store suffixes and directionals.

55. The system of claim 53, wherein said different types of postal addresses further include postmaster and general delivery addresses, and wherein said plurality of second arrays includes a Sector Vector Array which stores the add-on's for postmaster and general delivery addresses.

56. The system of claim 52, wherein said controller includes means responsive to a zip code input for converting the zip code into a Zip Index, means responsive to an input postal address for sequentially retrieving and decompressing compressed data records, means for comparing postal address information contained in the decompressed compressed data records with the input postal address to locate an applicable compressed data record, and means responsive to the comparing for providing the add-on corresponding to the input postal address.

57. The system of claim 43, wherein said memory means comprises a semiconductor RAM, and said controller comprises a microprocessor.

* * * * *